United States Patent
Hisamoto

(10) Patent No.: US 8,017,974 B2
(45) Date of Patent: Sep. 13, 2011

(54) SEMICONDUCTOR DEVICE WITH INCREASED WITHSTAND VOLTAGE

(75) Inventor: Yoshiaki Hisamoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 13 days.

(21) Appl. No.: 12/174,940

(22) Filed: Jul. 17, 2008

(65) Prior Publication Data

US 2009/0184338 A1  Jul. 23, 2009

(30) Foreign Application Priority Data

Jan. 23, 2008 (JP) ................................ 2008-012743

(51) Int. Cl.
  *H01L 29/739* (2006.01)
(52) U.S. Cl. ........ 257/139; 257/288; 257/401; 257/901; 257/351; 257/378; 257/474; 257/273; 257/205; 257/E29.027; 257/E29.028; 257/E29.067; 257/E29.194; 257/E29.202; 257/E29.197
(58) Field of Classification Search .......... 257/288, 257/401, 901, 139, E29.197, E29.027, E29.028, 257/E29.066, E29.194, 351, 378, 474
See application file for complete search history.

(56) References Cited

U.S. PATENT DOCUMENTS

| | | | | |
|---|---|---|---|---|
| 5,485,022 A * | 1/1996 | Matsuda | | 257/133 |
| 5,485,023 A * | 1/1996 | Sumida | | 257/139 |
| 7,135,387 B2 * | 11/2006 | Nakazawa et al. | | 438/473 |
| 2003/0057522 A1 * | 3/2003 | Francis et al. | | 257/566 |
| 2004/0164349 A1 * | 8/2004 | Nishiwaki et al. | | 257/330 |
| 2005/0110075 A1 * | 5/2005 | Torii et al. | | 257/327 |
| 2006/0281263 A1 * | 12/2006 | Yamazaki et al. | | 438/285 |
| 2008/0038880 A1 * | 2/2008 | Okada et al. | | 438/138 |
| 2008/0054369 A1 * | 3/2008 | Schulze et al. | | 257/378 |

FOREIGN PATENT DOCUMENTS

| | | |
|---|---|---|
| JP | 9-121052 | 5/1997 |
| JP | 2002-299623 | 10/2002 |
| JP | 2002-299623 A | 10/2002 |
| JP | 2003249654 | * 5/2003 |
| JP | 2004-247593 | 9/2004 |
| JP | 2005-354031 | 12/2005 |
| KR | 10-0490801 | 7/1998 |
| KR | 10-1998-067237 | 10/1998 |
| KR | 10-0483579 | 12/1998 |
| KR | 10-2000-0013509 | 3/2000 |
| KR | 10-2002-0077197 | 10/2002 |
| KR | 10-2004-0077690 | 9/2004 |

* cited by examiner

*Primary Examiner* — Wael Fahmy
*Assistant Examiner* — Marc Armand
(74) *Attorney, Agent, or Firm* — Oblon, Spivak, McClelland, Maier & Neustadt, L.L.P.

(57) ABSTRACT

A semiconductor device having the present high withstand voltage power device IGBT has at a back surface a p collector layer with boron injected in an amount of approximately $3 \times 10^{13}/cm^2$ with an energy of approximately 50 KeV to a depth of approximately 0.5 μm, and an $n^+$ buffer layer with phosphorus injected in an amount of approximately $3 \times 10^{12}/cm^2$ with an energy of 120 KeV to a depth of approximately 20 μm. To control lifetime, a semiconductor substrate is exposed to protons at the back surface. Optimally, it is exposed to protons at a dose of approximately $1 \times 10^{11}/cm^2$ to a depth of approximately 32 μm as measured from the back surface. Thus snapback phenomenon can be eliminated and an improved low saturation voltage (Vce (sat))-offset voltage (Eoff) tradeoff can be achieved.

7 Claims, 22 Drawing Sheets

FIG.5

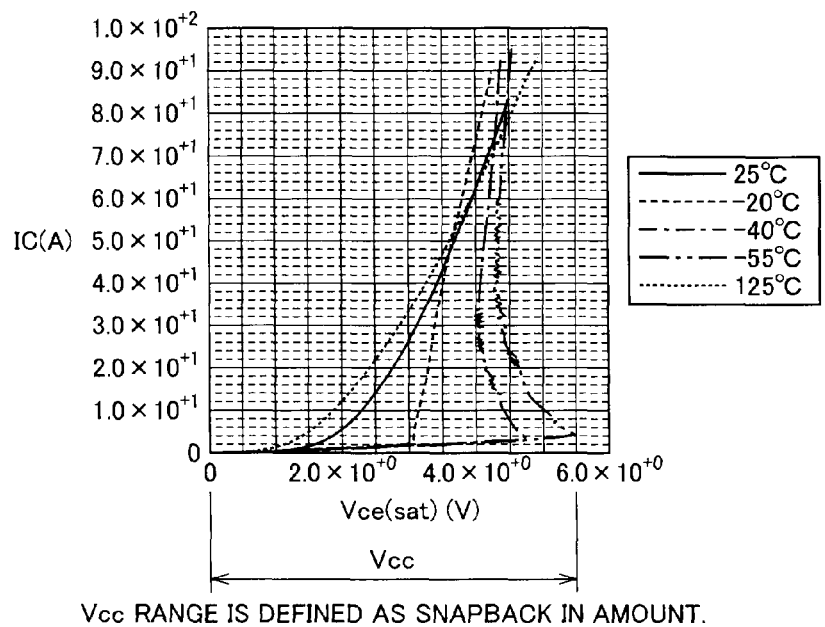

FT465AMW-FZ005 WAVEFORM OF CHARACTERISTIC OF OUTPUT
11-1 DOSE OF PROTONS FOR EXPOSURE:7e11/cm², Al:135 μm

Vcc RANGE IS DEFINED AS SNAPBACK IN AMOUNT.

FIG.6

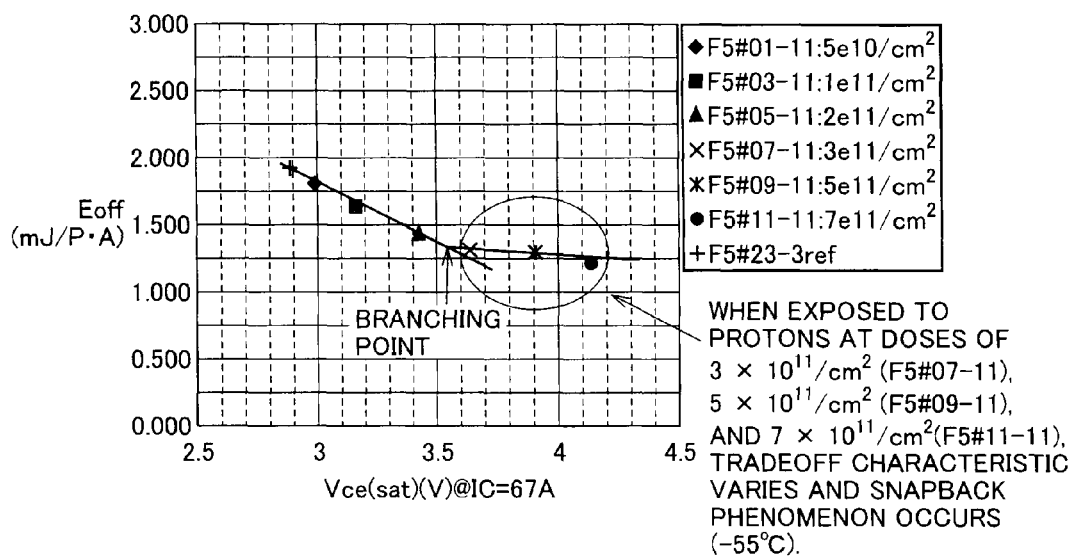

FT465AMW-FZ005 FMEA LOT
(1; DOSE OF PROTONS FOR EXPOSURE: VARIED,
AL ABSORBER'S THICKNESS: FIXED AT 135 μm)

WHEN EXPOSED TO PROTONS AT DOSES OF $3 \times 10^{11}/cm^2$ (F5#07-11), $5 \times 10^{11}/cm^2$ (F5#09-11), AND $7 \times 10^{11}/cm^2$ (F5#11-11), TRADEOFF CHARACTERISTIC VARIES AND SNAPBACK PHENOMENON OCCURS (-55°C).

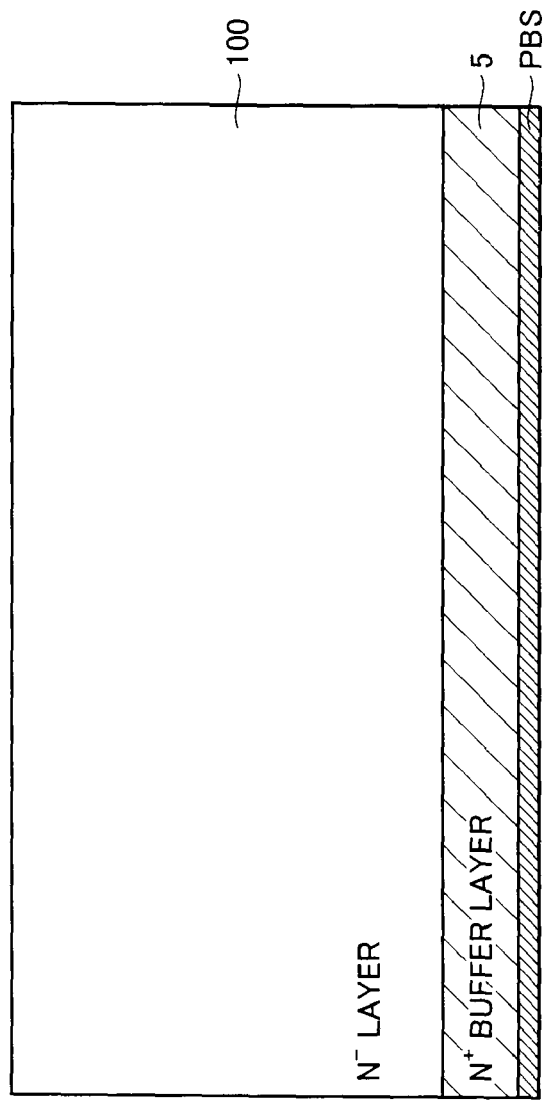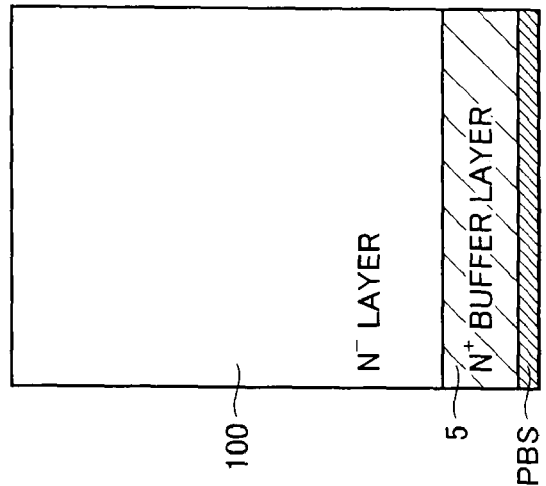

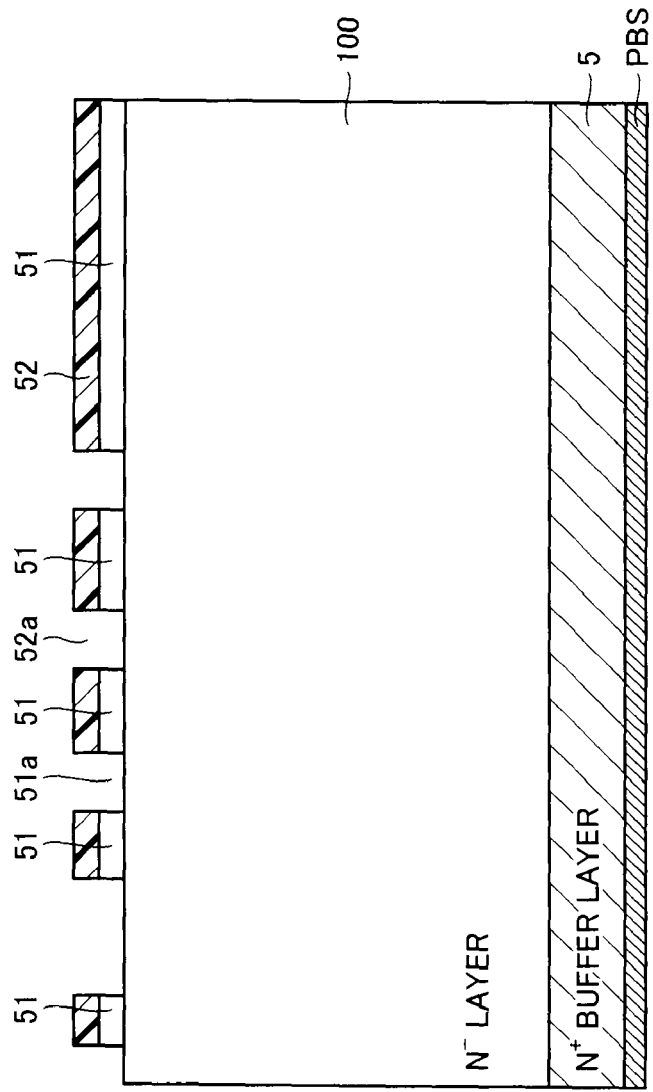

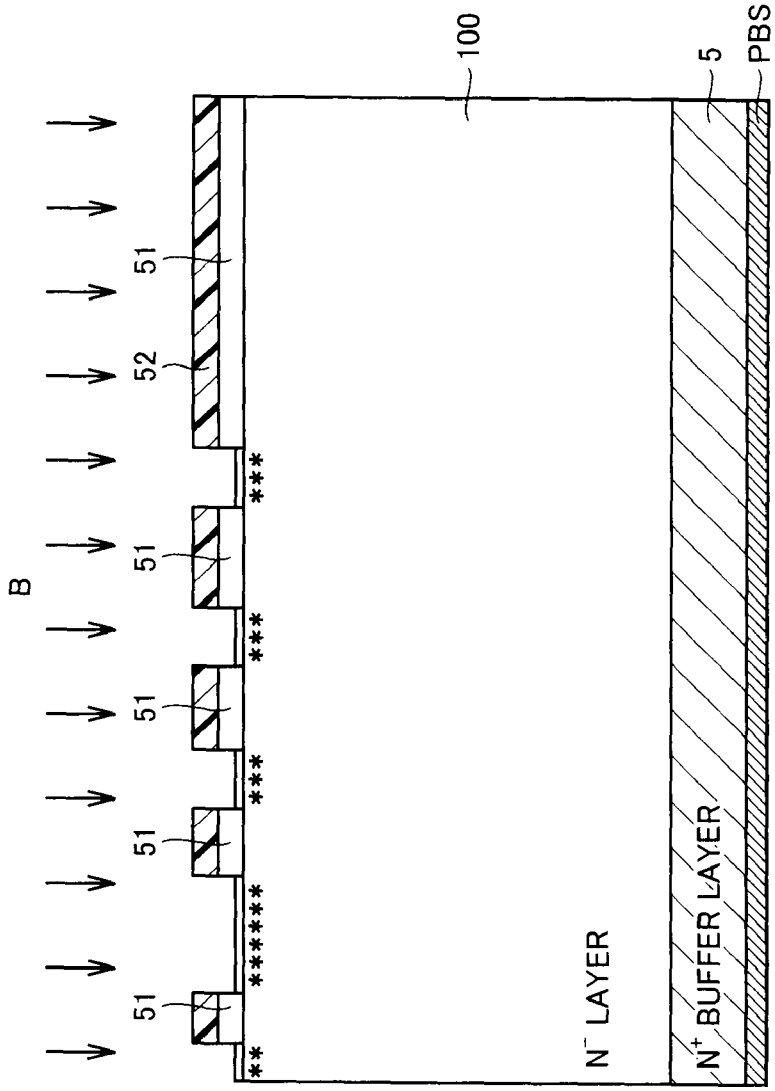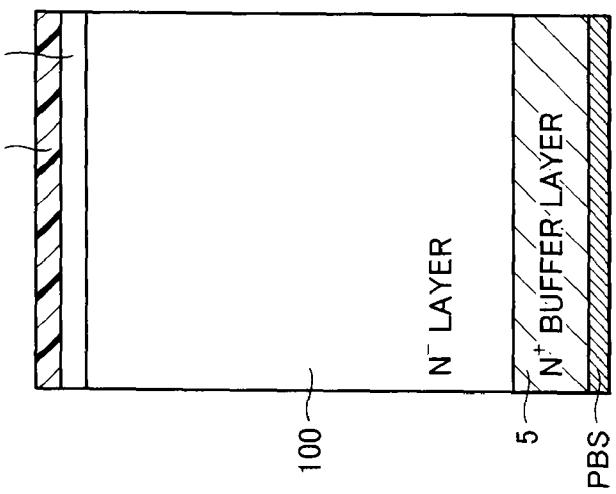

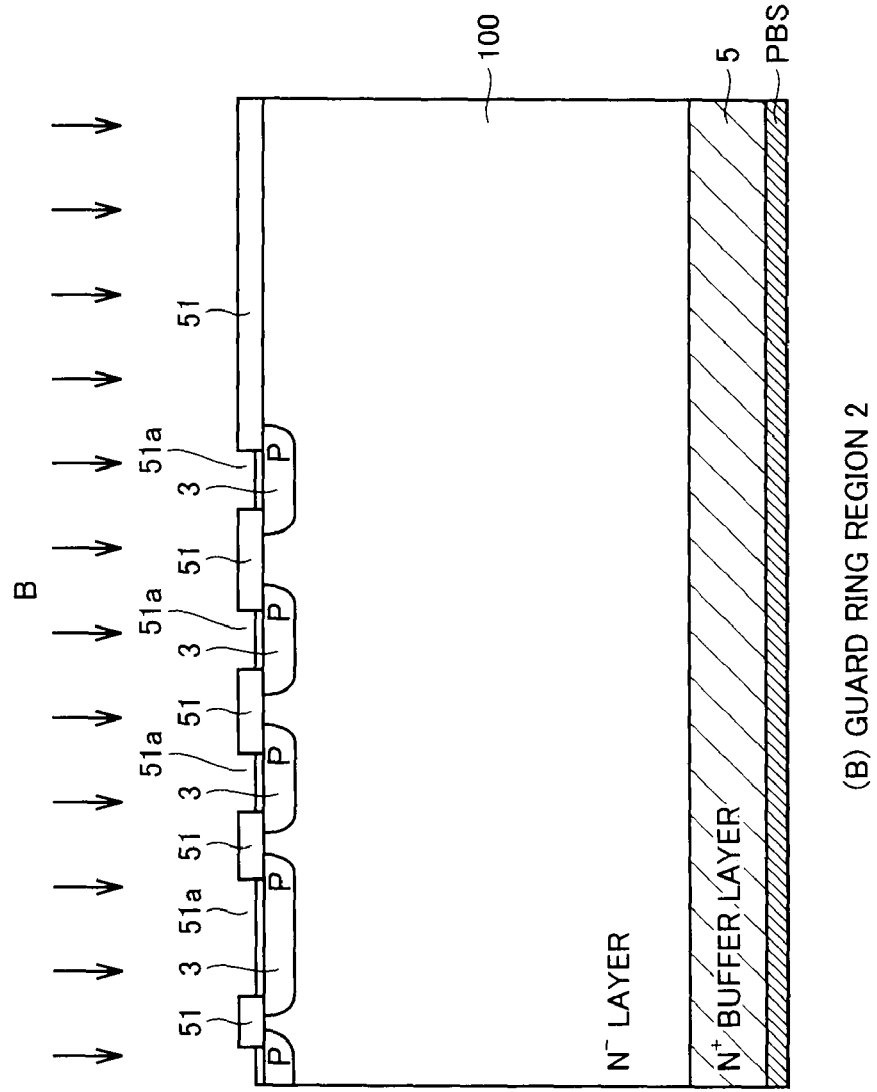
FIG.10A (A) MOS CELL REGION 1
FIG.10B (B) GUARD RING REGION 2

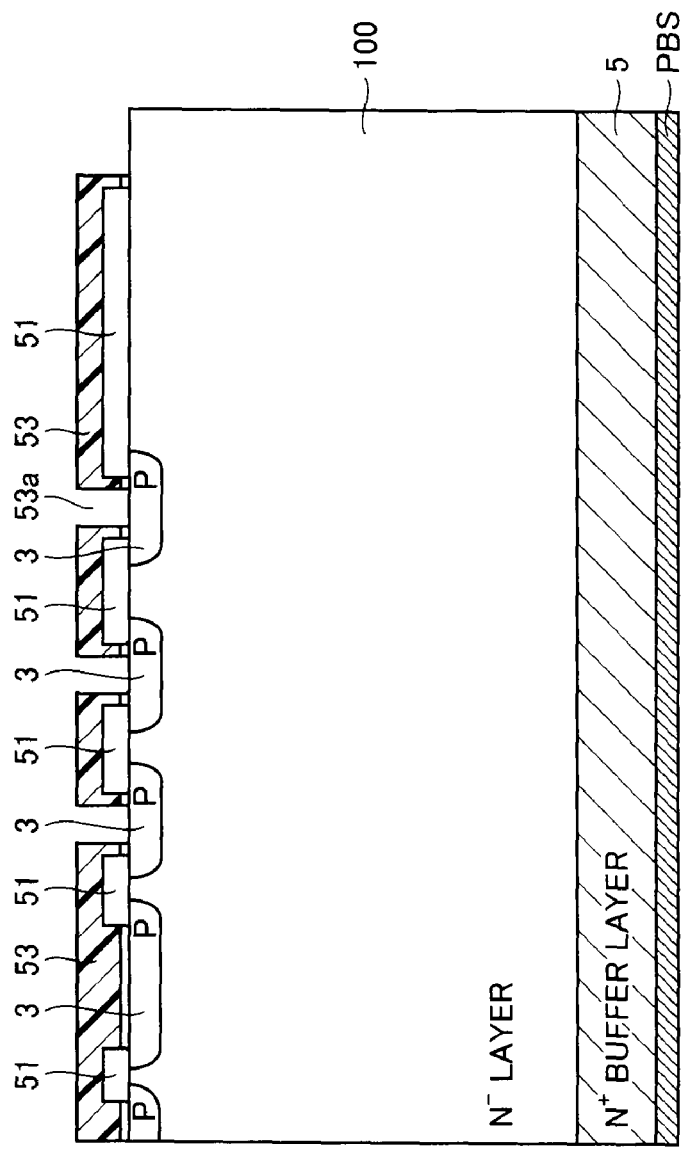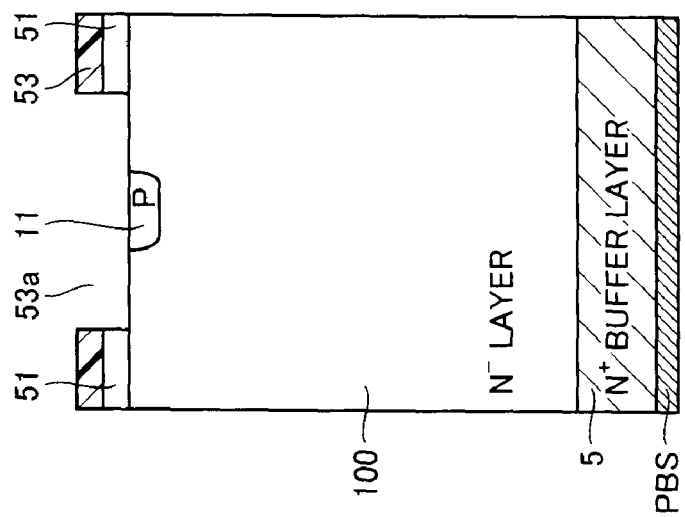

(A) MOS CELL REGION 1

(B) GUARD RING REGION 2

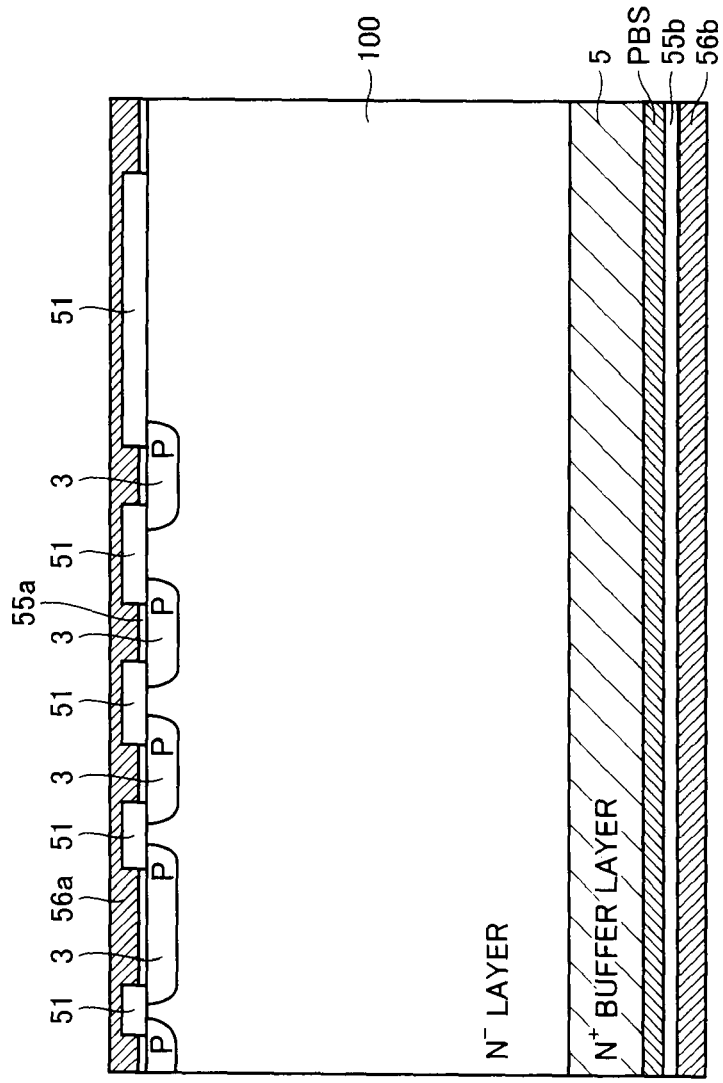
FIG.13A (A) MOS CELL REGION 1
FIG.13B (B) GUARD RING REGION 2

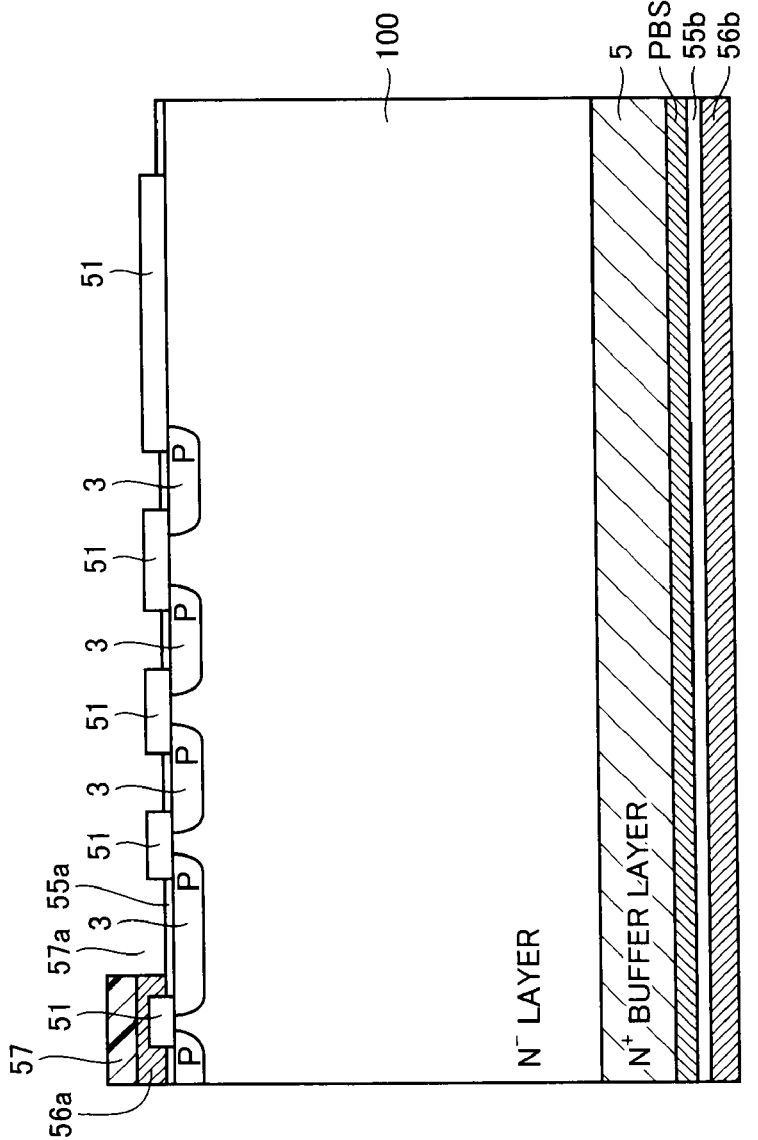

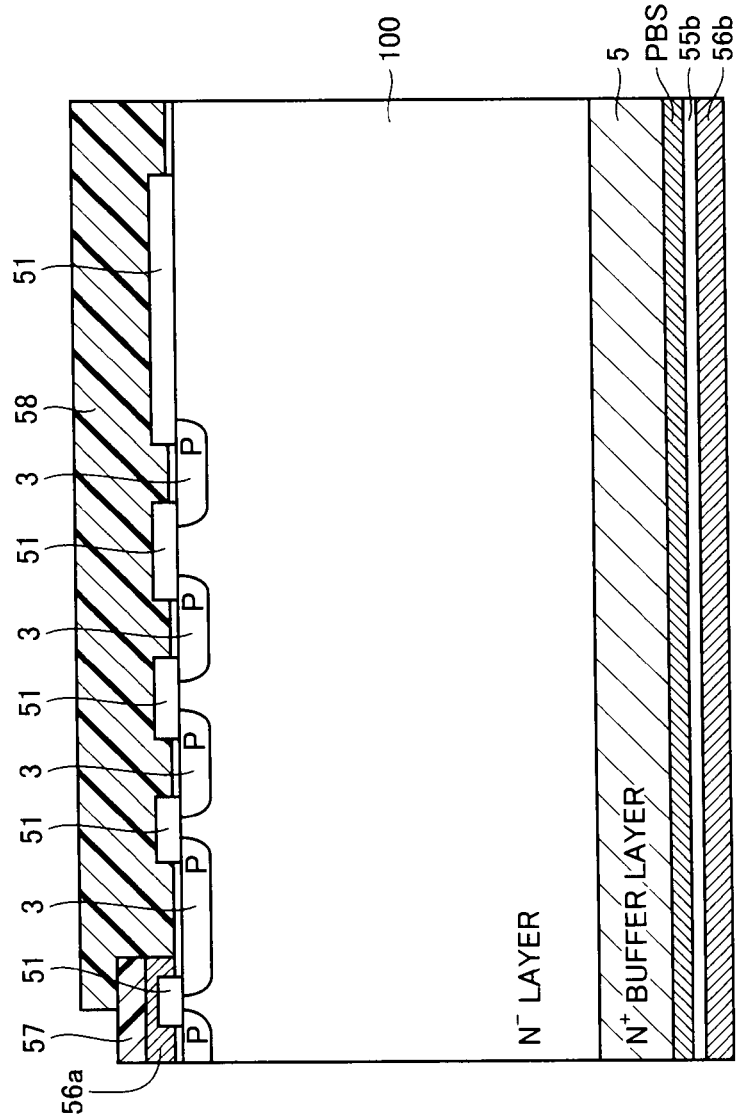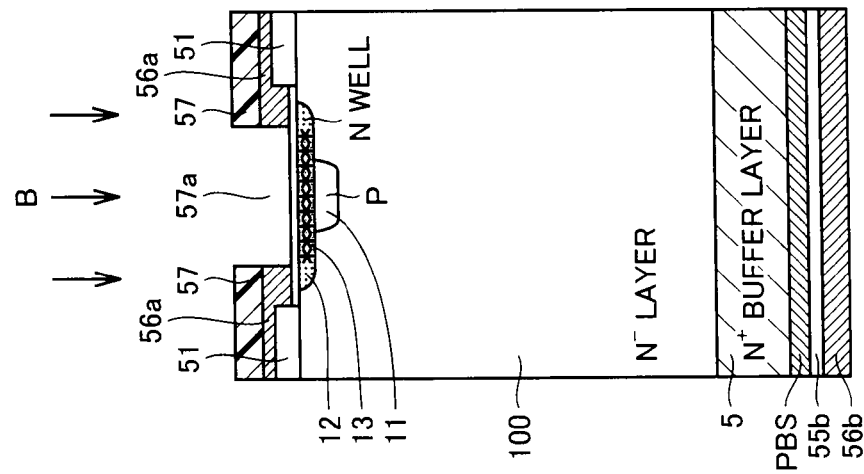

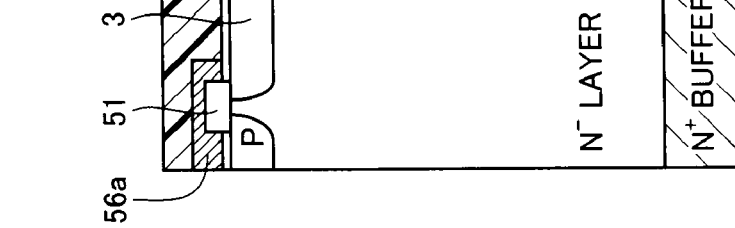
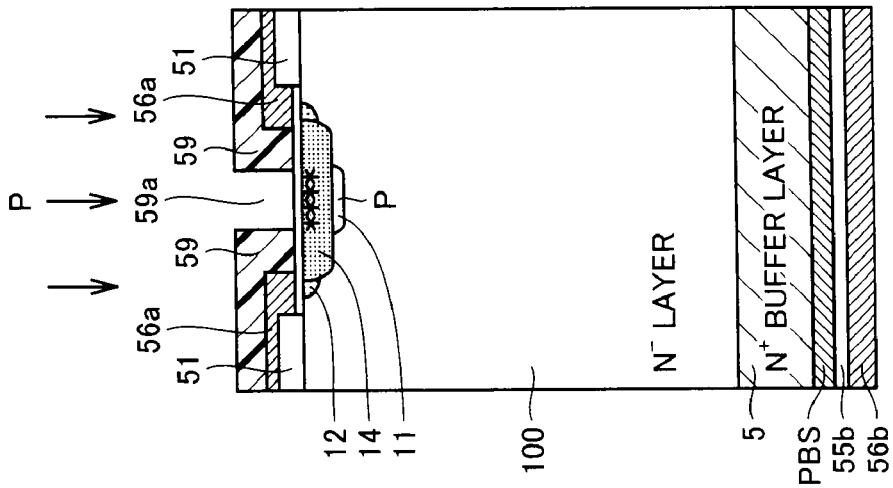
FIG. 16A (A) MOS CELL REGION 1
FIG. 16B (B) GUARD RING REGION 2

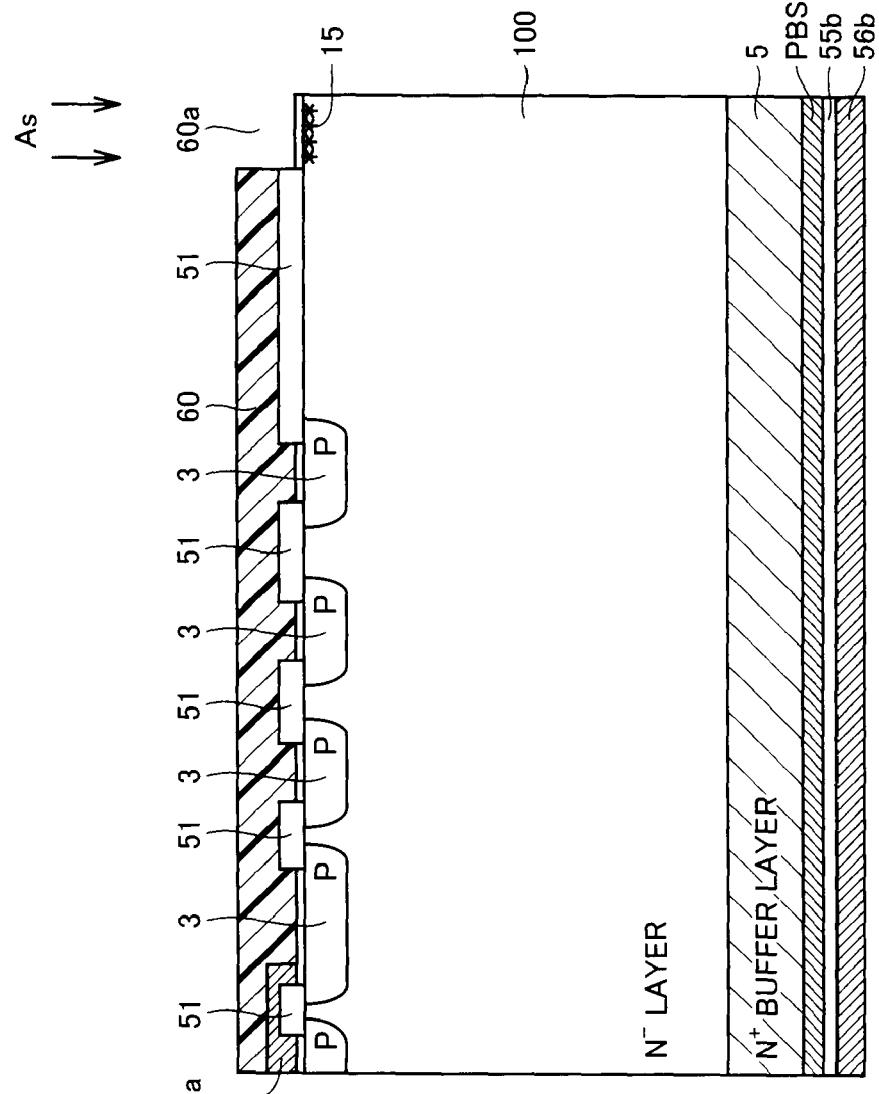
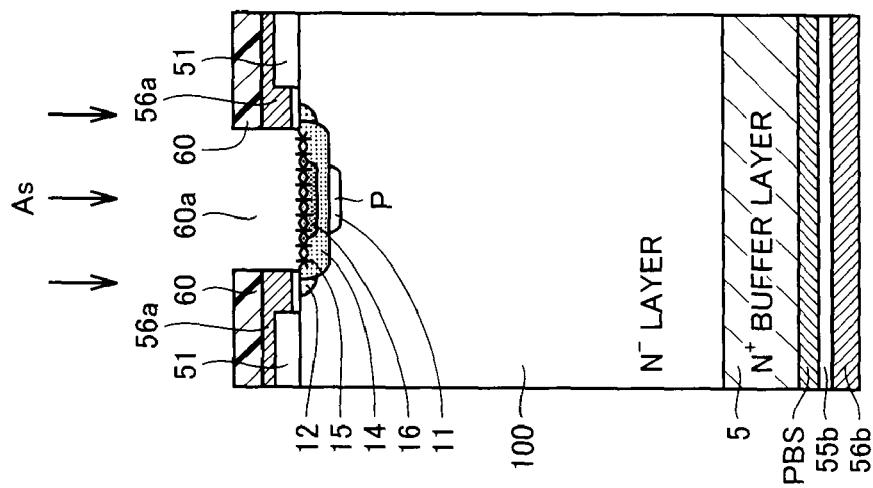
FIG.17A (A) MOS CELL REGION 1
FIG.17B (B) GUARD RING REGION 2

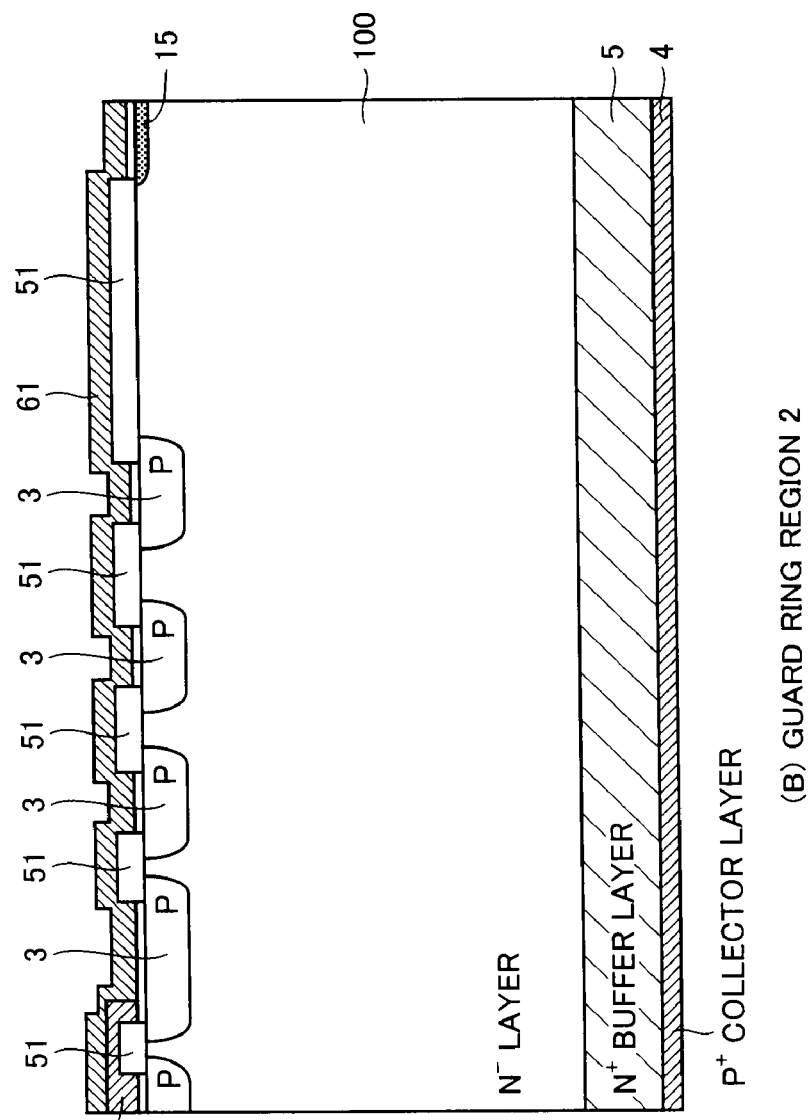

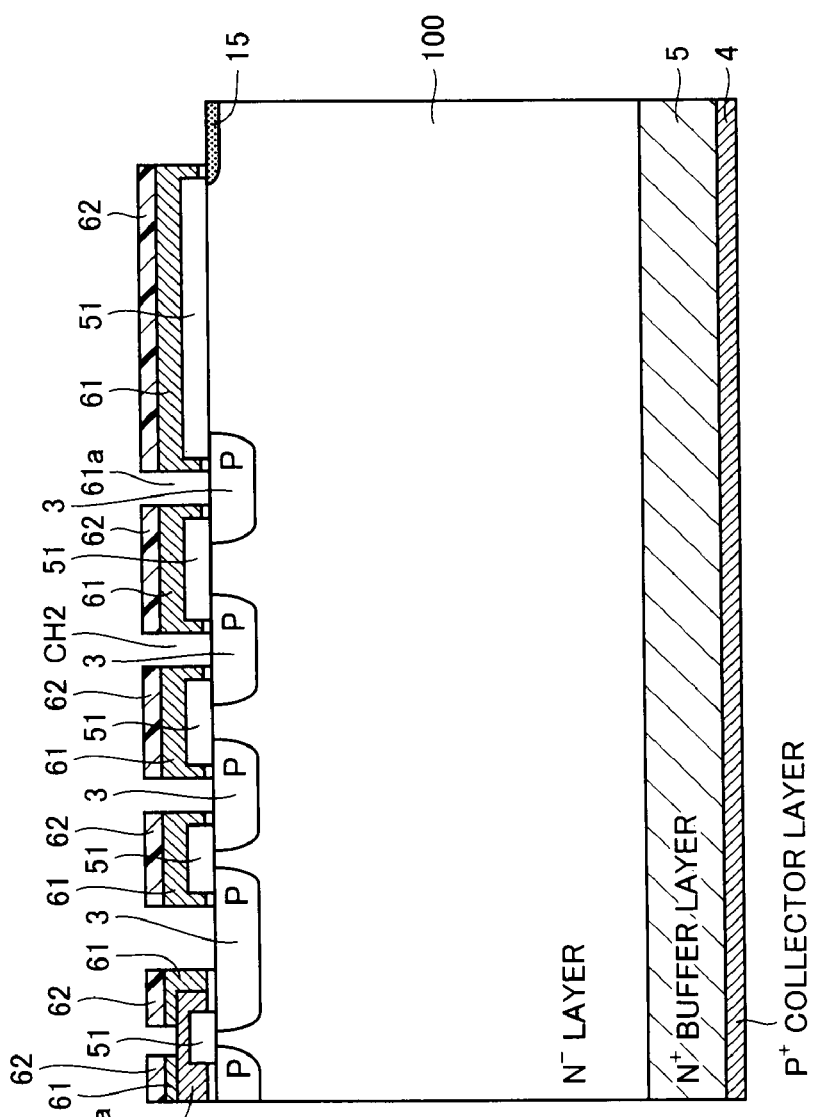

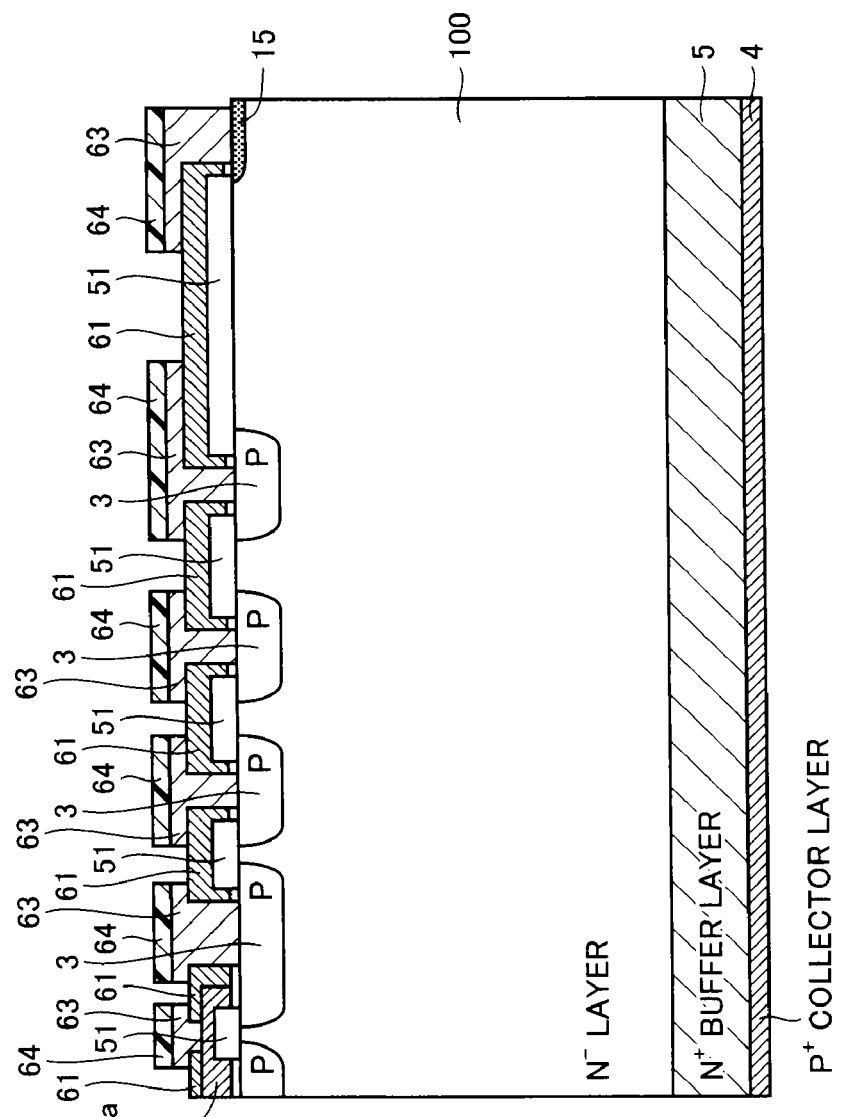

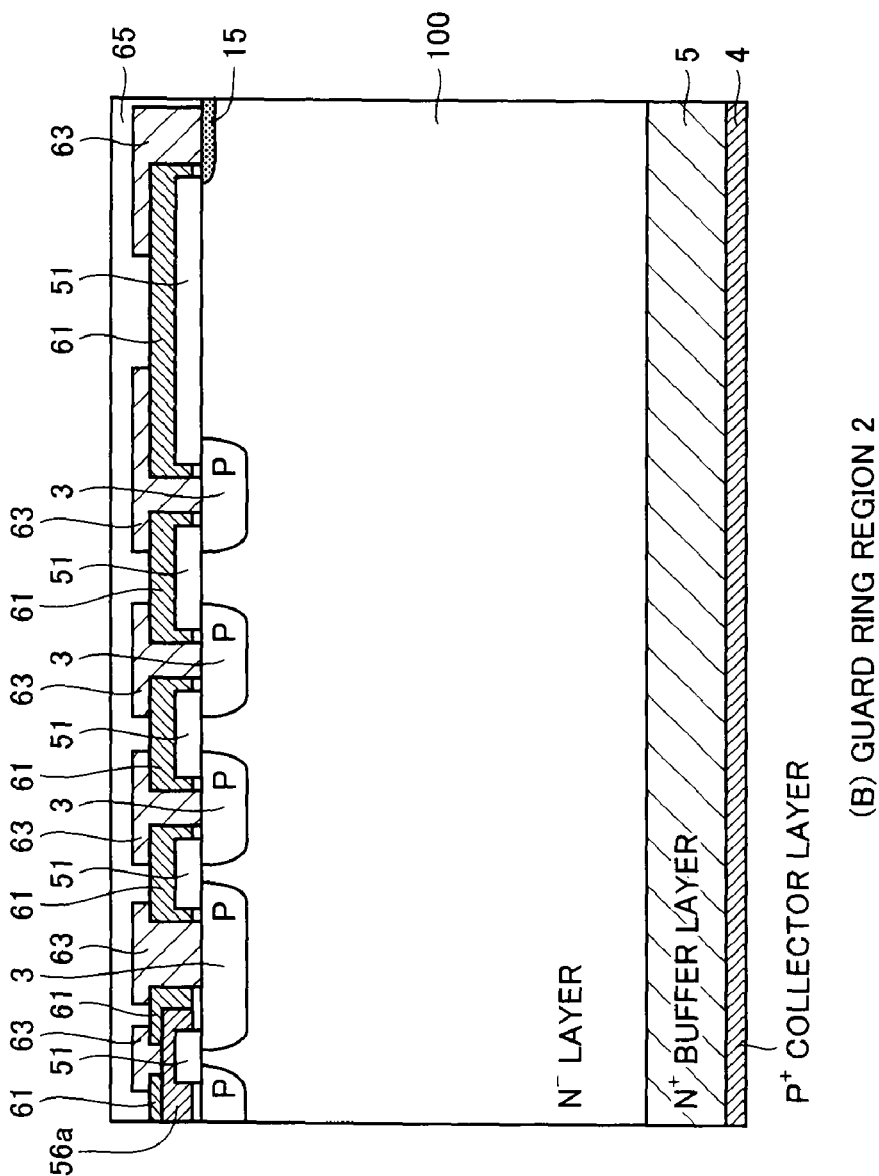

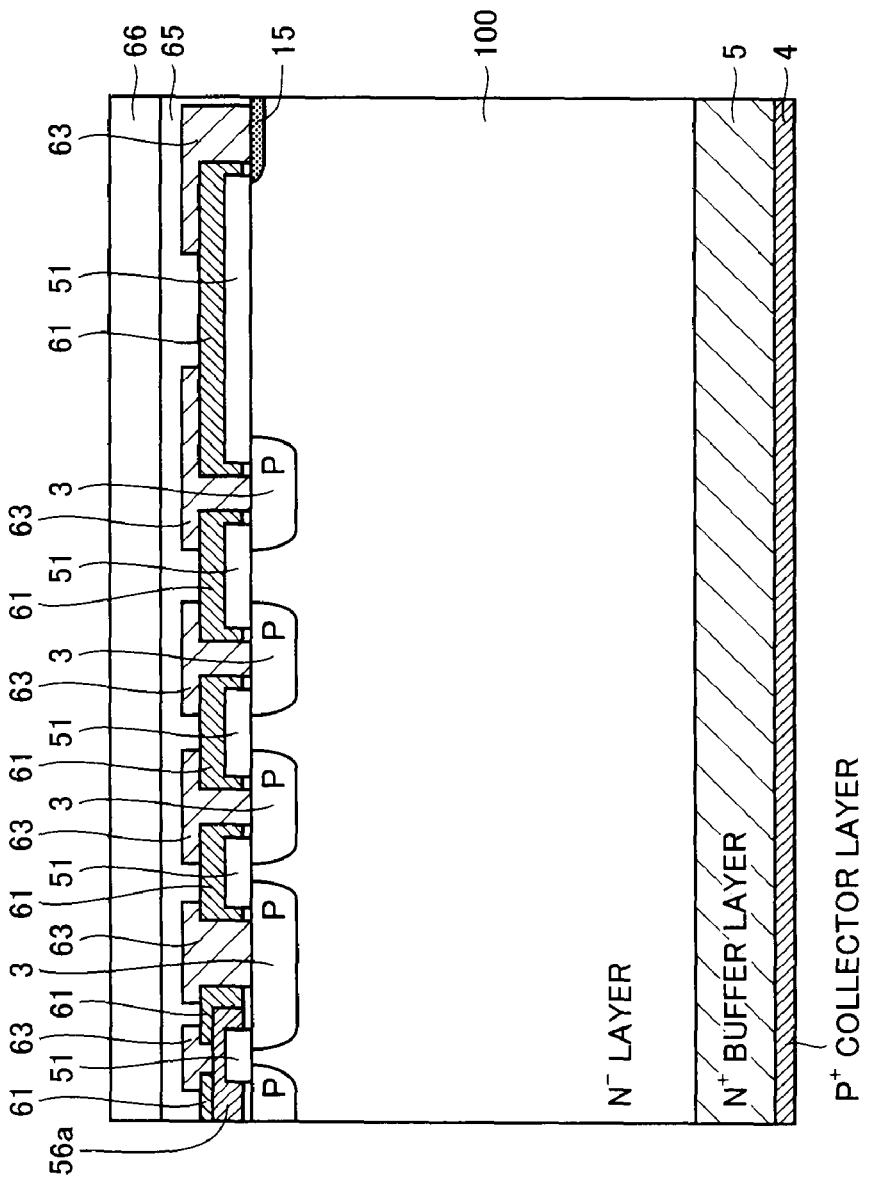
FIG.22A (A) MOS CELL REGION 1
FIG.22B (B) GUARD RING REGION 2

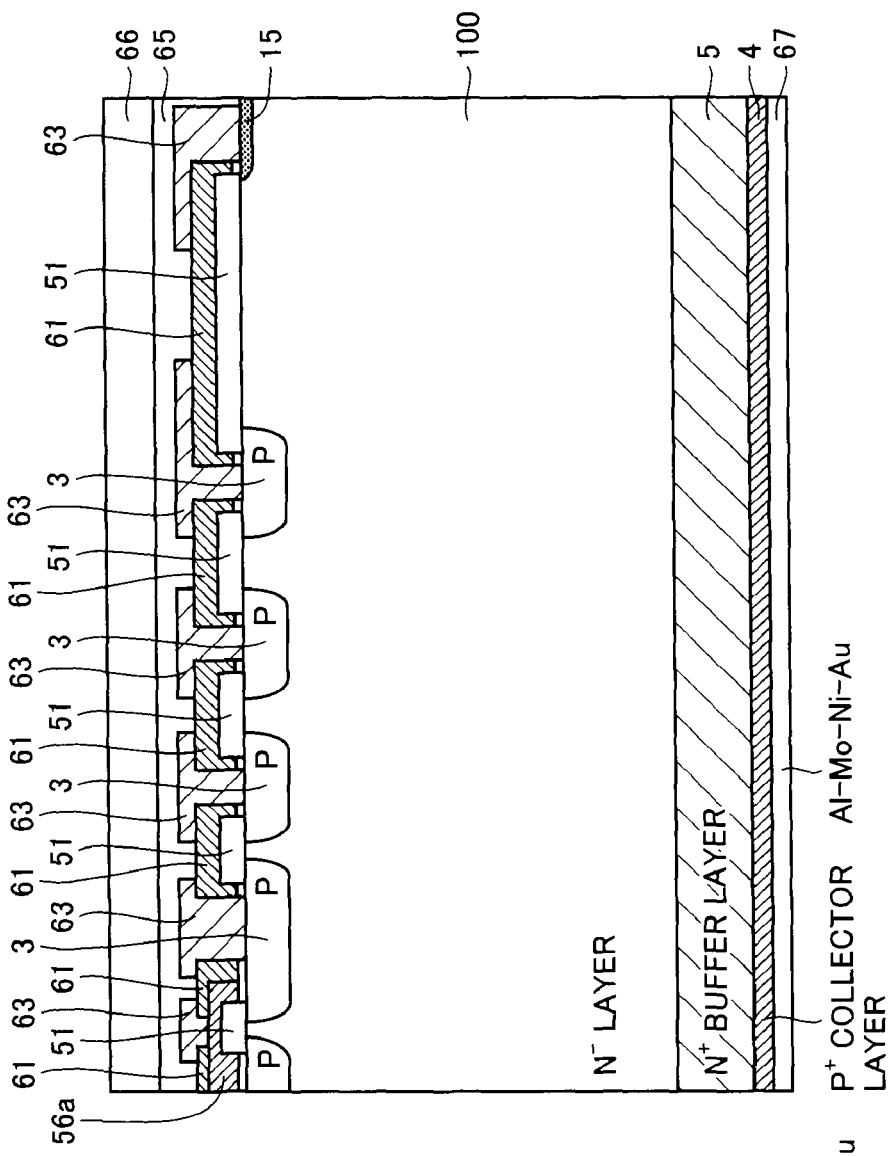

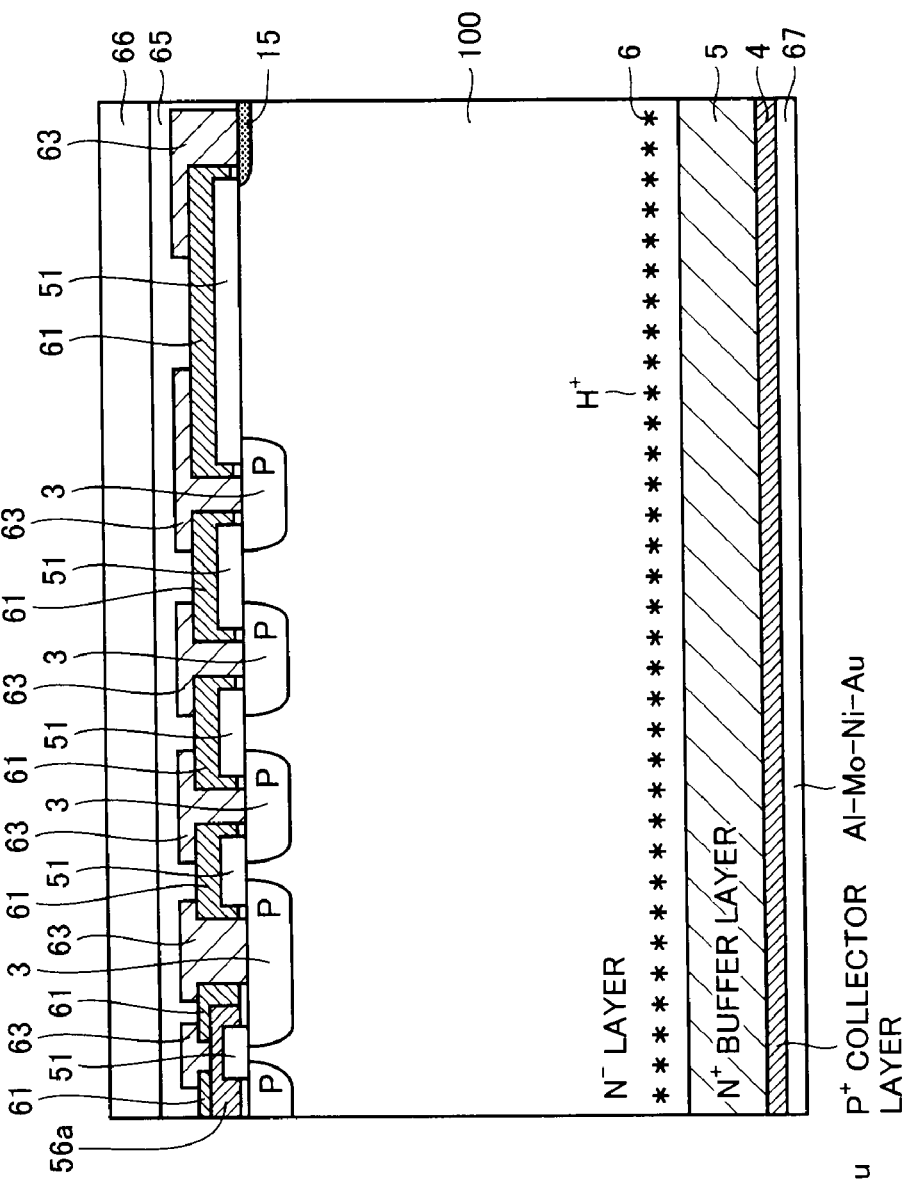

SEMICONDUCTOR DEVICE WITH INCREASED WITHSTAND VOLTAGE

BACKGROUND OF THE INVENTION

1. Field of the Invention

The present invention relates generally to semiconductor devices and particularly to structures of semiconductor devices that allows a high withstand voltage power device insulated gate bipolar transistor (IGBT) to have an improved electrical characteristic by shallowing a back surface structure and exposing it to protons in an optimized amount to improve low saturation voltage (Vce (sat))-offset voltage (Eoff) tradeoff to allow a semiconductor device having the high withstand voltage power device IGBT for electric power to have a stabilized characteristic and maintain robustness against destruction.

2. Description of the Background Art

For electric railroad applications, inverters and converters are controlled by employing semiconductor devices for electric power that are implemented as IGBT module. For electric railroad applications, high withstand voltage IGBTs mainly of 3.3 KV and 6.5 KV are employed.

A recent new specification required for electric railroad applications is to ensure operation at a low temperature of −55° C. In a conventional specification, for −55° C., low saturation voltage (Vce (sat))'s characteristic waveform is a negative temperature characteristic. Furthermore, current and voltage characteristic waveform is also a negative temperature characteristic.

When an n⁻ type semiconductor substrate is exposed to a large quantity of protons, it has an increased defect layer. The increased defect layer means increased kernels for recombination. This results in a reduced lifetime. Note that minority carriers that are generated or remain recombine with majority carriers and thus disappear. An average time elapsing before they disappear is referred to as a lifetime. More correctly, it is referred to as a lifetime of minority carriers.

Lifetime indicates a positive temperature characteristic. Accordingly, for lower temperature, lifetime is further reduced and snapback phenomenon is increased. In other words, when an n⁻ type semiconductor substrate is exposed to a large quantity of protons, a phenomenon similar in terms of lifetime to reduction in temperature will manifest.

Snapback phenomenon is determined by a product of injection efficiency by transport factor. If the product is small, a large snapback phenomenon manifests. Injection efficiency is determined by a difference in temperature of a pn junction of a back surface of the semiconductor substrate. Transport factor is determined by lifetime, an n⁻ layer's thickness, the semiconductor substrate's inherent impurity concentration, and the like.

If the n⁻ layer's thickness is large and the semiconductor substrate's inherent impurity concentration is small, a smaller transport factor is provided. When a high withstand voltage power device IGBT with such a small transport factor has a back surface containing an impurity reduced in concentration, snapback phenomenon more readily occurs. Accordingly it is important to expose the semiconductor substrate at the back surface to protons in an amount to control lifetime (or transport factor).

In contrast, for increased temperature, increased lifetime is provided. This is because high temperature provides an increased probability that minority carriers that have once recombined and thus disappeared are regenerated by thermal energy, resulting in increased, generated carriers. Accordingly, residual carriers increase, and a phenomenon similar to effectively increased lifetime will manifest. Japanese Patent Laying-open No. 2002-299623 discloses a high withstand voltage power device IGBT.

SUMMARY OF THE INVENTION

An issue to be addressed by the present invention lies in that a conventional high withstand voltage power device IGBT requires controlling the amount of holes injected from a p type collector region that is required for an operation of a MOS (Metal-Oxide-Semiconductor) unit cell formed at a major surface thereof.

Therefore the present invention contemplates a semiconductor device having a high withstand voltage power device IGBT that has a structure that can achieve an improved tradeoff characteristic and maintain and improve robustness against destruction that is possibly attributed to an influence of invalid carriers by properly controlling the amount of holes injected from a p type collector region.

Furthermore, it also lies in providing a semiconductor device having a structure that can prevent variation in low saturation voltage (Vce (sat)) and reduce or prevent snapback phenomenon at a low temperature of −55° C. by exposing a semiconductor substrate at a back surface to protons in an optimized amount.

A semiconductor substrate as based on the present invention includes: a semiconductor element region provided at a front surface of a semiconductor substrate of a first conduction type; and a collector layer of a second conduction type and a buffer layer of the first conduction type provided in the semiconductor substrate in a direction of a depth of the semiconductor substrate as seen from a back surface of the semiconductor substrate. The collector layer includes a region of an impurity of the second conduction type in the semiconductor substrate at a region located from the back surface to a depth of approximately 0.5 μm, with the impurity of the second conduction type having a concentration with a maximum value of approximately $2\times10^{16}/cm^3$. The buffer layer contains an impurity of the first conduction type in the semiconductor substrate at a region located at a depth from approximately 0.5 μm to approximately 20 μm as measured from the back surface of the semiconductor substrate, with the impurity of the first conduction type having a concentration with a maximum value of approximately $3\times10^{15}/cm^3$. A donor layer including a defect layer in the semiconductor substrate at a region located at a depth of approximately 32 μm as measured from the back surface is provided.

The present invention can provide a semiconductor substrate in which collector and buffer layers' respective concentrations and depths, and a donor layer of a defect layer that contains an impurity having a concentration having a projecting profile can be combined together to provide a high withstand voltage power device IGBT having an improved low saturation voltage (Vce (sat))-offset voltage (Eoff) tradeoff characteristic.

Furthermore, there can be provided a 3.3 KV-Planaer-IGBT having a semiconductor substrate having a back surface that has a pn structure containing an impurity controlled in concentration and diffused to a depth, as controlled, and is exposed to protons in a controlled amount to eliminate snapback phenomenon of low saturation voltage Vce (sat) for operation at a low temperature of −55° C. to reduce variation in low saturation voltage Vce (sat) and stabilize a loss of a switching characteristic.

Furthermore, the robustness against destruction of an IGBT module in an individual operation can also be improved. A semiconductor substrate can thus have a back surface that has a p type collector layer and an n type buffer layer having their respective impurities controlled in concentration and depth and is exposed to protons for a donor layer in a controlled amount to provide a high withstand voltage power device IGBT as a product ranging from high to low speed applications.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows snapback phenomenon in an embodiment of the present invention.

FIG. 6 shows a low saturation voltage Vce (sat)-offset voltage (Eoff) tradeoff characteristic in an embodiment of the present invention.

FIGS. 7A and 7B to FIGS. 24A and 24B are cross sections showing first to 18th steps of a method of fabricating a high withstand voltage power device IGBT in an embodiment of the present invention, and in each figure, a reference character A denotes a MOS cell region and a reference character B denotes a guard ring region.

DESCRIPTION OF THE PREFERRED EMBODIMENTS

Hereinafter reference will be made to the drawings to describe a structure of a semiconductor device in an each embodiment of the present invention.

First Embodiment

Figure 1:
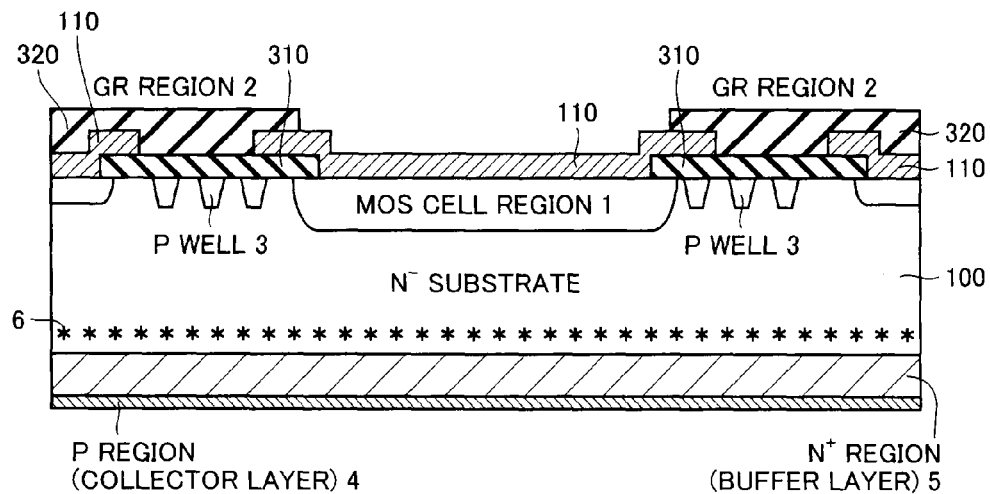
FIG. 1 shows a structure in cross section of a high withstand voltage power device IGBT in an embodiment of the present invention including a MOS cell region at a center and a guard ring region in a peripheral region.

With reference to FIG. 1, the present embodiment provides a high withstand voltage power device IGBT, as will be described hereinafter.

An n$^-$ type semiconductor substrate 100 has a back surface provided with a p type collector layer 4 and an n$^+$ type buffer layer 5. N$^-$ type semiconductor substrate 100 has a front surface provided at a center with a MOS cell region 1. MOS cell region 1 underlies gate electrode 110 with a gate insulation film (not shown) posed therebetween.

Furthermore, MOS cell region 1 is surrounded by a guard ring region 2. More specifically, n$^-$ type semiconductor substrate 100 has a front surface provided with a plurality of p type wells 3 that configure a guard ring annularly to surround MOS cell region 1. P type well 3 underlies a field oxide film 310 and an interlayer insulation film 320.

Maintaining a high withstand voltage power device IGBT's characteristic in withstand voltage requires optimizing n$^-$ type semiconductor substrate 100 in thickness and specific resistance. The present embodiment employs a 3.3 KV high withstand voltage power device IGBT implemented by a floating zone (FZ) wafer with n$^-$ type semiconductor substrate 100 having a thickness of approximately 320 μm to approximately 380 μm, and a specific resistance of approximately 220 Ωcm to approximately 280 Ωcm.

MOS cell region 1 provided at a major surface of n$^-$ type semiconductor substrate 100 adopts a conventional flat type DMOS (Double diffused Metal Oxide Semiconductor) structure. Guard ring region 2 surrounding MOS cell region 1 has p type wells 3 formed in a ring surrounding a chip of MOS cell region 1, and field oxide film 310 and interlayer insulation film 320, as has been described above, forming a multilayer structure serving as a protection film. P type well 3 serves to each maintain a withstand voltage of approximately 200 V. For higher withstand voltage, more p type wells 3 will be provided.

In the present embodiment, the high withstand voltage power device IGBT's back surface structure is important. In a conventional IGBT fabrication method, a back surface structure (p$^+$/n$^+$/n$^-$ structure) is formed prior to a major surface's MOS structure. After the back surface structure is formed, the major surface is polished and a fractured layer is removed, and a MOS cell region and a guard ring region are formed. Furthermore, a conventional IGBT has a p$^+$ collector layer having an impurity of high concentration, with the impurity diffused deep. Furthermore, an n$^+$ type buffer layer also has an impurity of high concentration.

More specifically, a conventional back surface structure has a p$^+$ collector layer with boron (B) injected in an amount of approximately $4.0\times10^{15}$/cm$^2$ with an energy of approximately 50 KeV to a depth of approximately 5.0 μm, and an n$^+$ type buffer layer with phosphorus (P) injected in an amount of approximately $3.3\times10^{14}$/cm$^2$ with an energy of approximately 2.80 KeV to a depth of approximately 20 μm, and is exposed to protons in an amount of approximately $3\times10^{11}$/cm$^2$ to approximately $5\times10^{11}$/cm$^2$.

In the present embodiment the back surface structure has an n$^+$ type buffer layer formed before the major surface has a MOS structure, as conventional. However, the back surface structure has a p type collector layer that is formed in a later process and is shallow. This fabrication method has a feature, which will be described later.

In the present embodiment, the back surface has p type collector layer 4 with boron (B) injected in an amount of approximately $3\times10^{13}$/cm$^2$ with an energy of approximately 50 KeV to a depth of approximately 0.5 μm, and an n$^+$ type buffer layer with phosphorus (P) injected in an amount of approximately $3\times10^{12}$/cm$^2$ with an energy of approximately 120 KeV to a depth of approximately 20 μm.

Furthermore, to control lifetime, the semiconductor substrate is exposed to protons. Optimally, it is exposed to protons in an amount of approximately $1\times10^{11}$/cm$^2$ to a depth of approximately 32 μm from the back surface. This can prevent snapback phenomenon and achieve an improved low saturation voltage (Vce (sat))-offset voltage (Eoff) tradeoff.

Conventional IGBT does not require to ensure operation at low temperature. As such, it had not been found that variation in low saturation voltage Vce (sat) is caused by snapback phenomenon. Accordingly in present embodiment it is noted that a cause of variation in low saturation voltage Vce (sat) causes snapback phenomenon, and a high withstand voltage power device IGBT can be provided that has a back surface optimized in structure and exposed to protons in an optimized amount to minimize snapback phenomenon and provide an improved low saturation voltage (Vce (sat))-offset voltage (Eoff) tradeoff.

Figure 2:
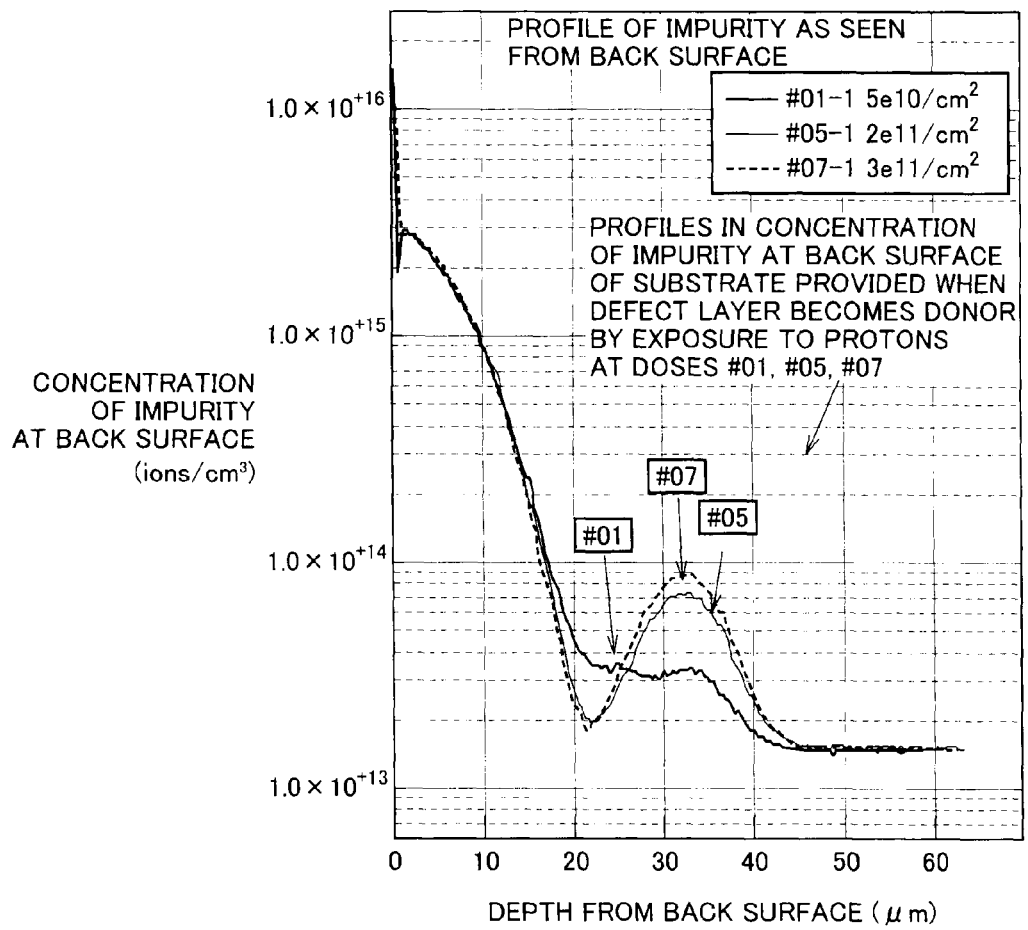
FIG. 2 shows a relationship that the high withstand voltage power device IGBT has between depth from its back surface (μm) and the back surface's impurity concentration (ions/cm$^3$).

As shown in FIG. 1 and FIG. 2, the present embodiment provides a high withstand voltage power device IGBT having a back surface structure that has p type collector layer 4 having a p type impurity region that is located in a region of n⁻ type semiconductor substrate 100 located from the back surface to a depth of approximately 0.5 μm, which is thinner than conventional by approximately 1/10, and has an impurity concentration profile with a p type impurity having a concentration with a maximum value of approximately $2 \times 10^{16}/cm^3$, and n⁺ type buffer layer 5 that has an n type impurity concentration in a region of n⁻ type semiconductor substrate 100 at a depth from approximately 0.5 μm to approximately 20 μm as measured from the back surface, and has an impurity concentration profile with the n type impurity concentration having a maximum value of approximately $3 \times 10^{15}/cm^3$.

By this structure, a hot leakage current has implemented approximately 100 μA/cm² in an IGBT of a 3.3 KV, high withstand voltage specification. As p type collector layer 4 is reduced in thickness from a conventional, approximately 400 μm to approximately 350 μm, low saturation voltage Vce (sat) is also reduced. N⁻ type semiconductor substrate 100 having holes injected thereinto in an optimized amount can further be exposed to protons in an optimized amount to obtain a high withstand voltage power device IGBT that can achieve a stabilized low saturation voltage Vce (sat)-offset voltage (Eoff) tradeoff characteristic.

FIG. 2 shows a relationship between depth from the back surface (>m) and the back surface's impurity concentration (ions/cm³). A result is shown of different amounts of protons for exposure for an optimal specification of p type collector layer 4 and n⁺ type buffer layer 5 of the high withstand voltage power device IGBT of the present embodiment shown in FIG. 1. Nos. 01-1, 05-1, and 07-1 show impurity concentration profiles of the back surface of the substrate versus depth from the back surface for doses of protons of approximately $5 \times 10^{10}/cm^2$, approximately $2 \times 10^{11}/cm^2$, and approximately $3 \times 10^{11}/cm^2$, respectively, for exposure.

As shown in FIG. 2, the impurity concentration profiles indicated by Nos. 01-1, 05-1, and 07-1 show impurity concentration profiles going upward as a defect layer becomes a donor in a vicinity of a depth of approximately 32 μm (or a projected range (Rp)) from the back surface of n⁻ type semiconductor substrate 100 by exposure to protons. The impurity concentration profiles indicated by Nos. 01-1, 05-1, and 07-1 show a profile for a dose of protons for exposure at an upper limit value allowing a temperature characteristic of −55° C. and a low saturation voltage Vce (sat) characteristic to be negative temperature characteristics. It has been found that for at most dose No. 05-1 of protons for exposure, snapback phenomenon does not occur at a low temperature of −55° C.

For example, as based on the profile in concentration indicated in FIG. 2 by No 05-1, if protons are injected into n⁻ type semiconductor substrate 100 in an amount of approximately at most $2 \times 10^{11}/cm^2$ for exposure, donor layer 6 will have a concentration of approximately at most $7.5 \times 10^{13}/cm^3$.

Furthermore, exposing semiconductor substrate 100 at a drift region to protons, as shown in FIG. 2, forms a defect layer containing an impurity having a concentration having a projecting profile having a half width of approximately 10 μm to approximately 5 μm.

Furthermore, a dose of protons of approximately $2 \times 10^{11}/cm^2$ for exposure and protons' projected range (Rp) set at the depth of buffer layer 5 plus approximately 10 μm (Rp=42 μm) also provided a defect layer containing an impurity having a concentration having a projecting profile having a half width of approximately 10 μm.

Thus a high withstand voltage power device IGBT can be provided that exhibits a stabilized low saturation voltage Vce (sat)-offset voltage (Eoff) tradeoff characteristic.

Figure 3:
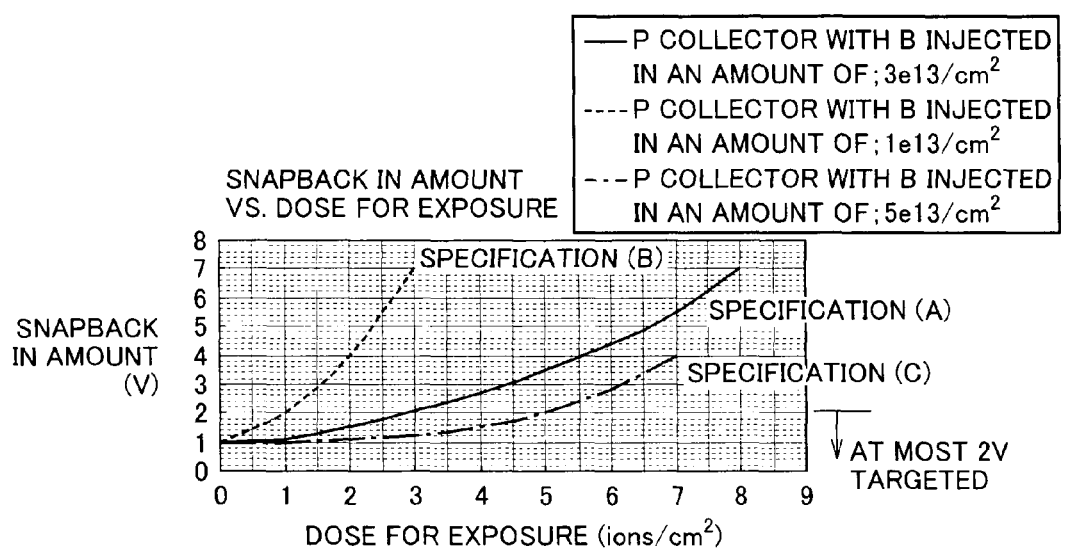
FIG. 3 shows a relationship that the high withstand voltage power device IGBT has between snapback in amount (V) and a dose of protons for exposure (ions/cm$^2$).

FIG. 3 shows a relationship between snapback in amount (V) and a dose of protons for exposure (ions/cm²). FIG. 3 is a graph quantifying snapback in amount at −55° C. They axis (or vertical axis) represents a Vcc range of an I-V characteristic shown in FIG. 5 of a snapback waveform caused when the IGBT's low saturation voltage Vce (sat) is measured. It is represented in volts. The x axis (or horizontal axis) represents a dose of protons for exposure in $[\times 1 \times 10^{11}/cm^2]$.

From a result of the experiment, it is determined that the Vcc range is controlled to be approximately at most 2 V and that a dose of protons for exposure is controlled up to approximately $2 \times 10^{11}/cm^2$. If p type collector layer 4 has a concentration (or boron (B) injected in an amount) of approximately $1 \times 10^{13}/cm^2$ [a Specification B], snapback phenomenon appears for a dose of protons for exposure equivalent to approximately $1 \times 10^{11}/cm^2$.

If p type collector layer 4 has a concentration (or boron (B) injected in an amount) of approximately $5 \times 10^{13}/cm^2$ [a specification C], snapback phenomenon appears for a dose of protons for exposure equivalent to approximately $5 \times 10^{11}/cm^2$. Thus, a dose of protons for exposure can be controlled in a range of approximately $1 \times 10^{11}/cm^2$ to approximately $5 \times 10^{11}/cm^2$. If p type collector layer 4 has a concentration (or boron (B) injected in an amount) of approximately $3 \times 10^{13}/cm^2$ [a specification A], snapback phenomenon appears for a dose of protons for exposure equivalent to approximately $3 \times 10^{11}/cm^2$.

Thus for the above [specification C], a dose of protons for exposure can be controlled in a wide range from approximately $1 \times 10^{11}/cm^2$ to approximately $5 \times 10^{11}/cm^2$. N⁻ type semiconductor substrate 100 having a back surface that has p type collector layer 4 controlled in structure and is exposed to protons in a controlled amount thus allows a high withstand voltage power device IGBT to exhibit a stabilized low saturation voltage Vce (sat)-offset voltage (Eoff) tradeoff characteristic, as desired by customers.

Figure 4:
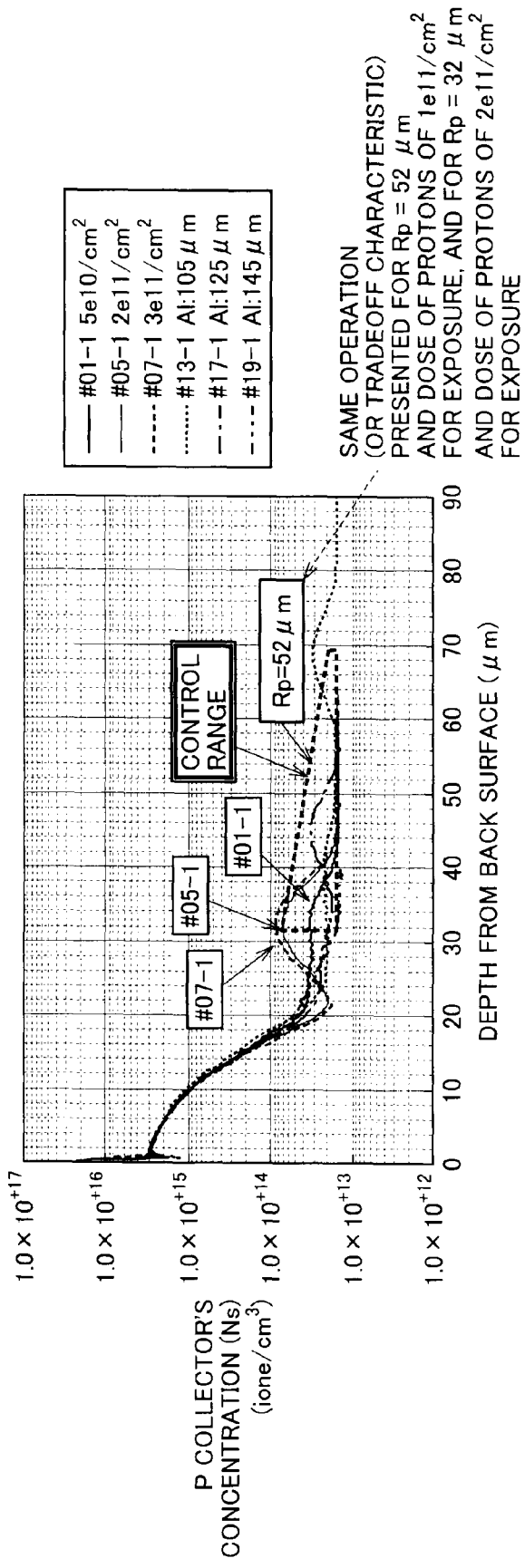
FIG. 4 shows a relationship that the high withstand voltage power device IGBT has between depth from its back surface (μm) and a p type collector's concentration (Ns) (ions/cm$^3$).
Figures 12A, 12B:
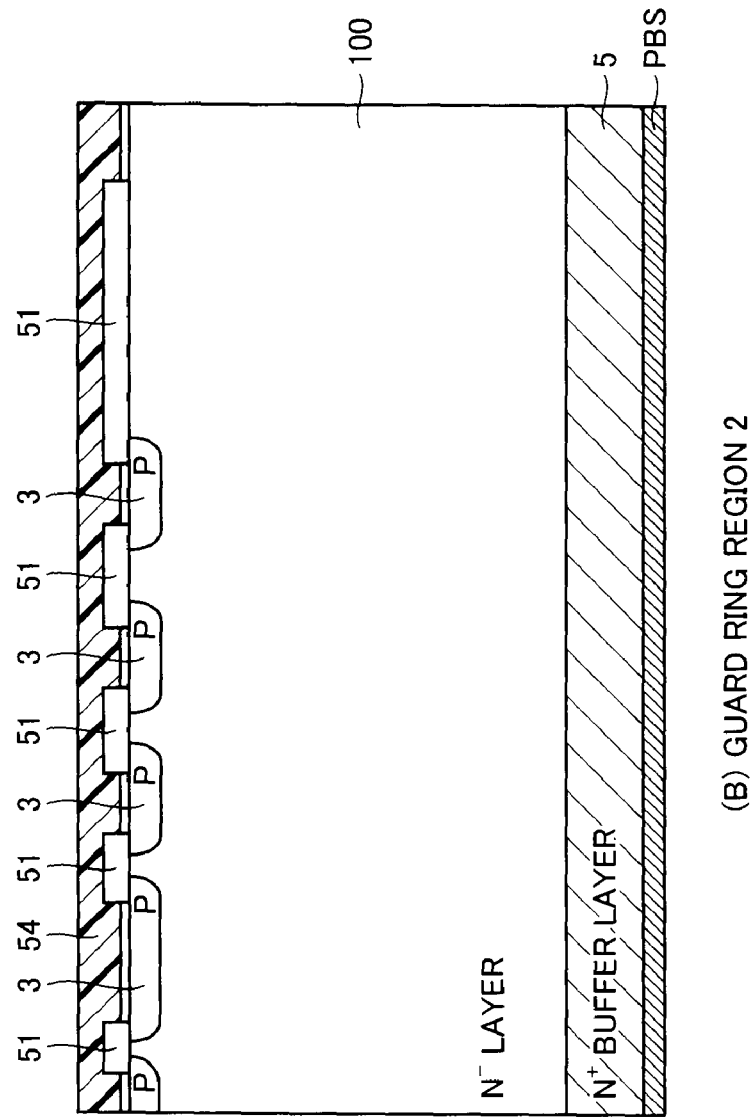

FIG. 4 shows a relationship between depth from the back surface (>m) and the p type collector's concentration (Ns) (ions/cm³). In this figure, n⁻ type semiconductor substrate 100 has the back surface with a pn structure, as well as the FIG. 1 structure, such that an Al absorber is varied in thickness and the back surface is exposed to different amounts of protons, and a proton control range providing the same (withstand voltage or like IGBT) characteristic is shown.

An example with an Al absorber of approximately 135 μm in thickness, protons' projected range (Rp) of approximately 32 μm, and a dose of protons of approximately $1 \times 10^{11}/cm^2$ for exposure, and an example with an Al absorber of approximately 115 μm in thickness, protons' projected range (Rp) of approximately 52 μm, and a dose of protons of approximately $5 \times 10^{10}/cm^2$ for exposure provide equivalent (withstand voltage or like IGBT) characteristics. From this result, a control range avoiding snapback phenomenon for −55° C. is set.

Note that donor layer 6, as shown in FIG. 4, includes a defect layer such that the dose of protons for exposure is approximately $1 \times 10^{11}/cm^2$ and the protons' projected range (Rp) is set at the position of the depth of buffer layer 5 plus approximately 20 μm (Rp=52 μm), and this defect layer has a donor concentration of approximately at most $3.5 \times 10^{13}/cm^3$ and is also approximately twice to third times the concentration of the semiconductor substrate.

In FIG. 4, a region of a broken line including a region between the peak concentrations of "No. 05-1 (dose of protons for exposure: $2 \times 10^{11}/cm^2$, and concentration at which the defect layer becomes a donor: approximately $7\times10^{13}/cm^3$)" and "for Rp=52 μm (dose of protons for exposure: approximately $1\times10^{11}/cm^2$, and concentration at which the defect layer becomes a donor: approximately $3.5\times10^{13}/cm^3$)" is set as a proton control range that maintains a tradeoff characteristic.

FIG. 5 shows snapback phenomenon in the present embodiment. The figure shows how an output's characteristic varies for a range of −55° C. to 125° C. (−55° C., −40° C., −20° C., 25° C., 125° C.) for a dose of protons of approximately $7\times10^{11}/cm^2$ for exposure, an acceleration voltage of approximately 4.2 MeV, and an Al absorber having a thickness of approximately 135 μm. The Vcc range is defined as snapback in amount.

Protons' projected range (Rp) corresponds to a position of exposure proposed in the present embodiment. It is a position of approximately 32 μm measured from the back surface. For 25° C. (room temperature) and 125° C., snapback phenomenon is not observed, and variation in low saturation voltage Vce is not noticed. In the present embodiment, optimization is done to also prevent snapback phenomenon for −55° C.

FIG. 6 shows a low saturation voltage Vce (sat)-offset voltage (Eoff) tradeoff characteristic in the present embodiment. In FIG. 6, a symbol "+" (F5#23-3ref) indicates a high withstand voltage power device IGBT product having a back surface which has a p type collector layer having boron (B) injected in an amount of approximately $3\times10^{13}/cm^2$, and an n type buffer layer having phosphorus (P) injected in an amount of approximately $3\times10^{12}/cm^2$, and is unexposed to protons.

An F5#01-11 high withstand voltage power device IGBT received a dose of protons of approximately $5\times10^{10}/cm^2$ for exposure. An F5#03-11 high withstand voltage power device IGBT received a dose of protons of approximately $1\times10^{11}/cm^2$ for exposure. An F5#05-11 high withstand voltage power device IGBT received a dose of protons of approximately $2\times10^{11}/cm^2$ for exposure. An F5#07-11 high withstand voltage power device IGBT received a dose of protons of approximately $3\times10^{11}/cm^2$ for exposure. An F5#09-11 high withstand voltage power device IGBT received a dose of protons of approximately $5\times10^{11}/cm^2$ for exposure. An F5#11-11 high withstand voltage power device IGBT received a dose of protons of approximately $7\times10^{11}/cm^2$ for exposure. With such different doses of protons for exposure, the low saturation voltage Vce (sat)-offset voltage (Eoff) tradeoff characteristic exhibits a relationship, as shown in FIG. 6.

With reference to FIG. 6, snapback phenomenon occurs first for F5#07-11 ($3\times10^{11}/cm^2$) surrounded by a circle. Between F5#05-11 ($2\times10^{11}/cm^2$) and F5#07-11 ($3\times10^{11}/cm^2$), there is a branching point at which the tradeoff characteristic varies.

Thus the present embodiment provides a high withstand voltage power device IGBT, as shown in FIG. 1, that has a back surface having p type collector layer 4 having a surface containing an impurity at a concentration of approximately $2\times10^{16}/cm^3$ to a depth of approximately 0.5 μm, and n type buffer layer 5 having a surface containing an impurity at a concentration of approximately $3\times10^{15}/cm^3$ to a depth of approximately at most 20 μm, and an n⁻ type semiconductor substrate having a concentration of $2\times10^{13}/cm^3$. Furthermore, it is provided with donor layer 6 at a position exposed to a dose of protons of approximately at most $2\times10^{11}/cm^2$ and having a depth of approximately 32 μm (Rp).

Thus, combining a pn concentration and a depth, and donor layer 6 formed in a defect layer and containing an impurity having a concentration having a projecting profile together can provide a high withstand voltage power device IGBT exhibiting an improved low saturation voltage (Vce (sat))-offset voltage (Eoff) tradeoff characteristic. Furthermore, a 3.3 KV-Planaer-IGBT including a semiconductor substrate having a back surface that has a pn structure containing an impurity controlled in concentration and depth and is exposed to protons in a controlled amount can eliminate snapback phenomenon of low saturation voltage Vce (sat) for operation at a low temperature of −55° C., and thus reduce variation in low saturation voltage Vce (sat) and stabilize a loss of a switching characteristic.

Method of Fabrication

A semiconductor element of a 3.3 KV, high withstand voltage power device IGBT (an insulated gate bipolar transistor in particular) for electric power that has the FIG. 1 structure is fabricated in a method, as will now be described hereinafter with reference to FIGS. 7A and 7B to FIGS. 24A and 24B showing a structure in cross section.

The high withstand voltage power device IGBT described in the Background Art section is fabricated in a method generally including: lot formation, a back surface n type buffer diffusion step, a back surface p type collector diffusion step, a p type well formation step, a gate (1) formation step, a gate (2) formation step, a channel dope step, a p⁺ type impurity diffusion step, a source formation step, a contact (1) formation step, an aluminum interconnection (1) step, a glass coating step, a 4 layer vapor deposition (Al/Mo/Ni/Au) step, a lifetime control step (of a high speed type), and an annealing step.

In contrast, the present embodiment provides a high withstand voltage power device IGBT fabricated in a method different from the method employed in the Background Art. More specifically, the latter method initially forms the p⁺ type collector layer/n⁺ type buffer layer of the back surface by thermal diffusion, whereas the former method starts with a p type well formation step, and in a glass coating step and the following steps, adopts n type buffer and p type collector layer formation steps of a process for the back surface.

For example, it includes lot formation, a back surface n type buffer diffusion step (obtaining a lower concentration), a p type well formation step, a gate (1) formation step, a gate (2) formation step, a channel dope step, a p⁺ type impurity diffusion step, a source formation step, a back surface p type collector diffusion step (shallowing, and obtaining a lower concentration), a contact (1) formation step, an aluminum interconnection (1) step, a glass coating step, a 4 layer vapor deposition (Al/Mo/Ni/Au) step, and a lifetime control step (low lifetime control).

Hereinafter reference will be made to FIGS. 7A and 7B to FIGS. 24A and 24B showing a structure in cross section to describe a method of fabricating a high withstand voltage power device IGBT in the present embodiment.

With reference to FIGS. 7A and 7B, n⁻ type semiconductor substrate 100 is provided with a thickness of silicon (an n⁻ layer) and a specific resistance that are required to maintain the high withstand voltage power device IGBT's characteristic in withstand voltage. For a high withstand voltage power device IGBT of the 3.3 KV specification, a specific resistance of approximately 250 Ωcm to approximately 300 Ωcm, and n⁻ type semiconductor substrate 100 having a thickness of approximately 400 μm are preferable. As n⁻ type semiconductor substrate 100, a product of a high withstand voltage specification is fabricated to have opposite surfaces with poly back seal (PBS) thereon to remove heavy-metal contamination from the silicon. For FZ wafers for high withstand voltage IGBTs of the 3.3 KV and 6.5 KV specifications, other manufacturers also provide similar specifications. N⁻ type semiconductor substrate 100 contains an impurity having a concentration of approximately $3\times10^{12}/cm^2$.

N⁻ type semiconductor substrate 100 has its entire surface undergoing an oxidization step, and from the back surface, phosphorus is injected. This forms n⁺ type buffer layer 5 from the substrate's surface to a depth of tens μm. In the present embodiment, phosphorus (P) is injected in an amount of approximately $3 \times 10^{12}/cm^2$ with an energy of approximately 120 KeV to a depth of approximately 20 μm to form n⁺ type buffer layer 5.

With reference to FIGS. 8A and 8B, the front surface is polished by approximately 100 μm to obtain a fractured layer. Subsequently, an oxide film 51 of $SiO_2$ is deposited. Subsequently on oxide film 51a resist film 52 is deposited and photolithography is employed to selectively form an opening 52a. Subsequently, with resist film 52 used as an etching mask, oxide film 51 is selectively removed to form an opening 51a exposing n⁻ type semiconductor substrate 100.

With reference to FIGS. 9A and 9B, with resist film 52 and oxide film 51 used as a mask, boron is injected through openings 51a, 52a into a surface of n⁻ type semiconductor substrate 100 at guard ring region 2. Then, with reference to FIGS. 11A and 10B, in MOS cell region 1 selectively oxide film 51 is provided with an opening 51b, and subsequently through openings 51a, 51b boron is injected into a surface of n⁻ type semiconductor substrate 100. Subsequently, n⁻ type semiconductor substrate 100 is heated to diffuse the boron. Thus MOS cell region 1 is provided with p type diffusion region 11 and guard ring region 2 is provided with p type well 3.

Then with reference to FIGS. 11A and 11B, on oxide film 51a resist film 53 is deposited and subsequently photolithography is employed to selectively form an opening 53a in MOS cell region 1 and guard ring region 2. Subsequently, oxide film 51 exposed at opening 53a is etched. Then, with reference to FIGS. 12A and 12B, resist film 53 is removed and subsequently a surface of n⁻ type semiconductor substrate 100 undergoes oxidization prior to injection.

Subsequently, a resist film 54 is deposited on n⁻ type semiconductor substrate 100 and photolithography is employed to selectively form an opening 54a in MOS cell region 1. Subsequently through opening 54a phosphorus is injected in MOS cell region 1 at a surface of n⁻ type semiconductor substrate 100 into a shallow region. Subsequently, n⁻ type semiconductor substrate 100 is heated to diffuse the phosphorus. Thus MOS cell region 1 is provided with an n type well 12.

Then, with reference to FIGS. 13A and 13B, n⁻ type semiconductor substrate 100 has the overlying oxide film removed away and subsequently n⁻ type semiconductor substrate 100 is provided with gate oxide films 55a, 55b at the front and back surfaces. Subsequently, on gate oxide films 55a, 55b, polysilicon 56a, 56b is deposited to have a thickness of approximately 4,500 angstroms. Then, with reference to FIGS. 14A and 14B, n⁻ type semiconductor substrate 100 is provided thereon with a resist film 57 at the front surface on polysilicon 56a, and photolithography is employed to selectively form an opening 57a in MOS cell region 1 and guard ring region 2. Subsequently, resist film 57 having opening 57a is used as a mask and polysilicon 56a is thus etched.

Then, with reference to FIGS. 15A and 15B, a resist film 58 is deposited in guard ring region 2 to cover opening 57a of resist film 57. Subsequently, boron is injected in MOS cell region 1 through opening 57a of resist film 57 and thermally diffused to form a channel dope region 13.

Then, with reference to FIGS. 16A and 16B, resist film 58 is removed and subsequently in MOS cell region 1 a resist film 59 having a predetermined opening 59a is deposited. Subsequently, resist film 59 having opening 59a is used as a mask and phosphorus is thus injected and thermally diffused to form a p⁺ type diffusion region 14.

Then, with reference to FIGS. 17A and 17B, resist film 59 is removed and subsequently on MOS cell region 1 and guard ring region 2 a resist film 60 having a predetermined opening 60a is deposited. Subsequently, resist film 60 having opening 60a is used as a mask, and arsenic is thus injected and thermally diffused to form source region 15.

Then, with reference to FIGS. 18A and 18B, resist film 60 is removed and subsequently on n⁻ type semiconductor substrate 100 at the front surface a PSG (phospho silicate glass) film 61 is deposited to have a thickness of approximately 1 μm. Furthermore, at the back surface, oxide film 55b and polysilicon 56b are removed with an asher. Subsequently, a PBS getter annealing technique is fully utilized to remove the PBS film. Subsequently, the back surface is sufficiently gettered and subsequently p⁺ collector layer 4 is formed to be shallow.

Then, with reference to FIGS. 19A and 19B, in MOS cell region 1 and guard ring region 2 a resist film 61 having a predetermined opening 61a is deposited. Subsequently, resist film 61 having opening 61a is used as a mask and contact holes CH1, CH2 are thus formed. Note that contact holes CH1, CH2 are shaped in a method that does not damage the polysilicon's surface. More specifically, wet etching is performed and subsequently dry etching is performed.

Then, with reference to FIGS. 20A and 20B, n⁻ type semiconductor substrate 100 is provided thereon with an aluminum interconnection layer at the front surface by aluminum vapor deposition. Subsequently, a resist film 64 having a predetermined opening pattern is deposited and, with resist film 64 used as a mask, the aluminum interconnection layer is etched to form an aluminum electrode 63 in MOS cell region 1 and guard ring region 2 at a position as required.

Then, with reference to FIGS. 21A and 21B, resist film 64 is removed and subsequently in guard ring region 2 a glass coating film 65 is deposited to protect aluminum electrode 63. Then, with reference to FIGS. 23A and 23B, to protect glass coating film 65, a polyimide coating film 66 is further deposited. Then, with reference to FIGS. 23A and 23B, n⁻ type semiconductor substrate 100 is provided thereon at the back surface with a 4-layer, Al—Mo—Ni—Au structure forming a back surface electrode 67.

Then, with reference to FIGS. 24A and 24B, lifetime control is performed. More specifically, n⁻ type semiconductor substrate 100 is exposed to protons at a dose of approximately at most $2 \times 10^{11}/cm^2$ to have donor layer 6 in the back surface at a depth of approximately 32 μm (Rp). Note that the high withstand voltage power device IGBT fabricated in the above process has p type collector layer 4 having an impurity concentration profile with a p type impurity concentration having a maximum value of approximately $2 \times 10^{16}/cm^3$ in a region of n⁻ type semiconductor substrate 100 located from the back surface to a depth of approximately 0.5 μm, and n⁺ type buffer layer 5 having an impurity concentration profile with an n type impurity concentration having a maximum value of approximately $3 \times 10^{15}/cm^3$ in a region of n⁻ type semiconductor substrate 100 located at a depth from approximately 0.5 μm to approximately 20 μm as measured from the back surface. Furthermore, buffer layer 5 has a maximum concentration value approximately 150 times the concentration of n-type semiconductor substrate 100, and collector layer 4 has a maximum concentration value approximately 1,000 times the concentration of semiconductor substrate 100.

Thus, combining a pn concentration and a depth, and donor layer 6 of a defect layer that contains an impurity having a concentration having a projecting profile together can provide a high withstand voltage power device IGBT exhibiting an improved low saturation voltage (Vce (sat))-offset voltage (Eoff) tradeoff characteristic. Furthermore, a 3.3 KV-Planaer-IGBT including a semiconductor substrate having a back surface that has a pn structure containing an impurity controlled in concentration and depth and is exposed to protons in a controlled amount can eliminate snapback phenomenon of low saturation voltage Vce (sat) for operation at a low temperature of −55° C., and thus reduce variation in low saturation voltage Vce (sat) and stabilize a loss of a switching characteristic.

Note that in the above embodiment the back surface electrode's $p^+$ collector layer 4 and $n^+$ type buffer layer 5 have their impurities fixed in concentration and a lifetime control layer is selected to allow a tradeoff characteristic to be variable to accommodate more applications. Alternatively, varying $p^+$ collector layer 4 in concentration can also provide an equivalent tradeoff characteristic.

Furthermore, a gettering technique that can be developed commonly for any wafers has also been established as a technique of management that prevents a difference between materials for silicon and a difference between processes in level of contamination from affecting a characteristic. Conventionally, the back surface structure could not have a p type collector's concentration and an n type buffer layer controlled in profile. The technique allows such control, and holes can be injected in an optimized amount.

The low lifetime control layer that has been added has provided the tradeoff characteristic with more options. Switching loss reduction, and a switching characteristic's off loss (turn off loss) (Eoff)-on voltage (Vce (sat)) tradeoff characteristic can be repeated as aimed. The amount of hoes that has been optimized has also improved withstand voltage.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
 a semiconductor element region provided at a front surface of a semiconductor substrate of a first conduction type;
 a collector layer of a second conduction type and a buffer layer of said first conduction type provided in said semiconductor substrate in a direction of a depth of said semiconductor substrate as seen from a back surface of said semiconductor substrate; and
 a donor layer including a defect layer in said semiconductor substrate at a region located at a depth of approximately 32 μm as measured from the back surface of said semiconductor substrate, wherein
 said collector layer includes a region of an impurity of said second conduction type in said semiconductor substrate at a region located from the back surface of said semiconductor substrate to a depth of approximately 0.5 μm, said impurity of said second conduction type being injected in an amount of at most $1\times10^{13}/cm^2$,
 said buffer layer contains an impurity of said first conduction type in said semiconductor substrate at a region located at a depth from approximately 0.5 μm to approximately 20 μm as measured from the back surface of said semiconductor substrate, with said impurity of said first conduction type having a concentration with a maximum value of approximately $3\times10^{15}/cm^3$,
 said donor layer includes a defect layer formed with a dose of protons of at most $1\times10^{11}/cm^2$ for exposure, and
 said amount of said impurity injected in said collector layer and said dose of protons forming said defect layer reducing snapback voltage at low temperatures to be approximately at most 2V.

2. The semiconductor device according to claim 1, wherein said maximum value of said impurity concentration of said buffer layer is approximately 150 times an impurity concentration of said semiconductor substrate; and
 said maximum value of said impurity concentration of said collector layer is approximately 1,000 times the impurity concentration of said semiconductor substrate.

3. The semiconductor device according to claim 1, wherein said donor layer includes a defect layer exposed to protons injected at a dose of approximately at most $2\times10^{11}/cm^2$ into said semiconductor substrate at the back surface, said donor layer having a concentration of approximately at most $7.5\times10^{13}/cm^3$.

4. The semiconductor device according to claim 1, wherein said donor layer includes a defect layer containing an impurity concentration having a projecting profile half width of approximately 10 μm that is formed by exposing said semiconductor substrate at the back surface to protons at a dose of approximately $2\times10^{11}/cm^2$ with the protons' projected range (Rp) set at a position of a depth of said buffer layer plus approximately 10 μm.

5. The semiconductor device according to claim 1, wherein said donor layer includes a defect layer formed by exposing said semiconductor substrate at the back surface to protons at a dose of approximately $1\times10^{11}/cm^2$ with the protons' projected range (Rp) set at a position of a depth of said buffer layer plus approximately 20 μm, said defect layer having an impurity concentration of approximately at most $3.5\times10^{13}/cm^3$ and approximately twice to three times that of said semiconductor substrate.

6. The semiconductor device according to claim 1, wherein said donor layer includes a defect layer containing an impurity concentration having a projecting profile half width of approximately 10 μm to approximately 5 μm that is formed by exposing said semiconductor substrate at a drift region to protons.

7. The semiconductor device according to claim 1, wherein said donor layer includes a defect layer formed in said semiconductor substrate at a predetermined depth from the back surface containing an impurity concentration having a projecting profile, with an AL absorber of a predetermined thickness introduced to serve as an intermediate material between a source of protons for exposure and said semiconductor substrate.

* * * * *